United States Patent
Suzuki

(10) Patent No.: US 6,818,457 B2
(45) Date of Patent: Nov. 16, 2004

(54) SEMICONDUCTOR INTEGRATED CIRCUIT DEVICE AND METHOD OF MANUFACTURING THE SAME

(75) Inventor: Masayuki Suzuki, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/153,776

(22) Filed: May 24, 2002

(65) Prior Publication Data

US 2003/0008417 A1 Jan. 9, 2003

(30) Foreign Application Priority Data

Jul. 5, 2001 (JP) ........................................ 2001-204167

(51) Int. Cl.[7] .............................................. H01L 21/00
(52) U.S. Cl. ............................ 438/3; 438/240; 438/253
(58) Field of Search ........................... 438/3, 240, 253, 438/250, 254, 255, 398, 396

(56) References Cited

U.S. PATENT DOCUMENTS

| | | | | |
|---|---|---|---|---|
| 5,624,864 A | * | 4/1997 | Arita et al. | 438/3 |
| 5,960,252 A | * | 9/1999 | Matsuki et al. | 438/3 |
| 6,077,715 A | * | 6/2000 | Chivukula et al. | 438/3 |

FOREIGN PATENT DOCUMENTS

| | | |
|---|---|---|
| JP | 5-55464 | 3/1993 |
| JP | 7-161934 | 6/1995 |
| JP | 7-169917 | 7/1995 |

OTHER PUBLICATIONS

English translation of Jap Pat. No. 07–161934.*

* cited by examiner

Primary Examiner—Tuan H. Nguyen
(74) Attorney, Agent, or Firm—Antonelli, Terry, Stout & Kraus, LLP

(57) ABSTRACT

After formation of a lower electrode, made of an Ru film, over the side walls and bottom portion of a hole in a silicon oxide film, wherein an information storage capacitive element is to be formed, a tantalum oxide film, which is to serves as a capacitive insulating film, is deposited by CVD over the lower electrode. In order to improve the quality of this tantalum oxide film, heat treatment of it is conducted in a mixed gas atmosphere of $H_2O$ (water vapor) and $H_2$ (hydrogen), while controlling a partial pressure ratio of $H_2O$ to $H_2$ so as to fall within a region bounded by the curves (a) and (c) of FIG. 15. This heat treatment makes it possible to improve the quality of the tantalum oxide film, while preventing oxidation of the Ru film constituting the lower electrode.

59 Claims, 15 Drawing Sheets

SEMICONDUCTOR INTEGRATED CIRCUIT DEVICE AND METHOD OF MANUFACTURING THE SAME

BACKGROUND OF THE INVENTION

The present invention relates to a semiconductor device and to a method of manufacturing the same; and, more particularly, the invention relates to a technique that is effective when applied to a semiconductor device, such as a DRAM (Dynamic Random Access Memory), having a capacitive insulating film constituting an information storage capacitive element (capacitor).

The above-described DRAM is constituted of an array of memory cells, each of which has a memory cell selecting MISFET and an information storage capacitive element connected in series with this MISFET. This information storage capacitive element is formed, for example, by successively depositing silicon, so as to form a lower electrode, tantalum oxide, so as to form a capacitive insulating film, and silicon, so as to form an upper electrode.

For example, Japanese Patent Laid-Open No. Hei 5(1993)-55464 discloses a method of forming a tantalum-tungsten film 12 containing tantalum over a polycrystalline silicon film (lower electrode) 11, selectively oxidizing this film in a gas mixture of hydrogen and water vapor and forming a charge storage insulating film 14 from the resulting tantalum oxide film.

Japanese Patent Laid-Open No. Hei 7(1995)-169917 discloses a method of forming a tantalum oxide layer 5 over a high-concentration phosphorous-doped polycrystalline silicon layer (lower electrode) 3 and then crystallizing the tantalum oxide layer by first and second heat treatments. Japanese Patent Laid-Open No. Hei 7 (1995)-161934 discloses a method of forming a $Ta_2O_5$ film 5 as a capacitive insulating film over an Si-containing lower electrode (W film) 4, followed by heat treatment in an atmosphere of $H_2$ and water vapor.

SUMMARY OF THE INVENTION

When silicon is employed for a lower electrode, however, a silicon oxide nitride film is formed on the interface between the silicon and tantalum oxide upon crystallization of tantalum oxide to be formed over the lower electrode or heat treatment (at 700° C. in an oxygen atmosphere) of it for improving its quality, making it difficult to increase the dielectric constant.

The present inventor has carried out research and development of a DRAM and performed various investigations on the constitution and method of forming the above-described information storage capacitive element.

With the recent tendency to miniaturize a semiconductor integrated circuit device, the area of the information storage capacitive element tends to become smaller, making it difficult to maintain a desired capacitance. Therefore, it has become necessary to find electrode materials or capacitive insulating film materials that are capable of attaining a large capacitance, even if the capacitor has a small area.

The present inventor has conducted various investigations on the method of formation of an Ru film to be used as a lower electrode of an information storage capacitive element, presuming that a platinum group metal such as Ru is suited for increasing the capacitance because it does not form a film of a low dielectric constant, such as oxide nitride film, even during heat treatment, after the Ru film is formed; and, in addition, the Ru film can be formed so as to be thin, because it is a metal material.

When an Ru film is adopted as a lower electrode, however, a tantalum oxide film formed thereover tends to crack owing to volumetric expansion caused by oxidation of the Ru film upon crystallization or heat treatment (at 700° C. in an oxygen atmosphere) for improving its film quality, resulting in a deterioration in the product yield.

Even when the volumetric expansion caused by oxidation of the Ru film is not so severe as to cause deformation of the tantalum oxide film, oxygen in the Ru film transfers even to a portion (for example, plug) of the information storage capacitive element connecting with the memory cell selecting MISFET and forms an oxide, causing conduction failure.

An object of the present invention is to provide a technique for preventing oxidation of a lower electrode due to crystallization of a capacitive insulating film or heat treatment for improving its film quality.

Another object of the invention is to provide a technique for forming a good-quality capacitive insulating film or lower electrode, thereby improving the properties of the information storage capacitive element.

The above-described objects, other objects and novel features of the present invention will be apparent from the following description and the accompanying drawings.

Of the aspects and features of the invention disclosed in the present application, representative ones will be described briefly below.

1. A method of manufacturing a semiconductor device according to one aspect of the present invention comprises (a) forming a first conductor over a semiconductor substrate, (b) forming a first insulating film over said first conductor, and (c) after said step (b), heat treating said semiconductor substrate in an atmosphere containing water and hydrogen.

2. A method of manufacturing a semiconductor device according to another aspect of the present invention comprises (a) forming a first conductor over a semiconductor substrate, (b) forming a first insulating film over said first conductor and (c) heat treating said semiconductor substrate at 200 to 400° C. in an atmosphere containing water and hydrogen.

DETAILED DESCRIPTION OF THE PREFERRED EMBODIMENTS

Figure 1:
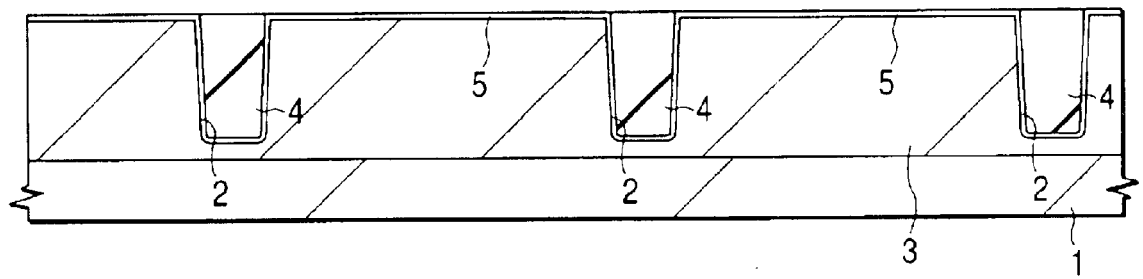
FIG. 1 is a fragmentary cross-sectional view of a semiconductor substrate illustrating a step in the method of manufacture of a semiconductor integrated circuit device according to Embodiment 1 of the present invention.

Embodiments of the present invention will be described more specifically based on the accompanying drawings. Incidentally, throughout all the drawings which illustrate these embodiments, like members having the same function will be identified by like reference numerals and overlapping descriptions will be omitted.

Embodiment 1

A method of manufacture of the DRAM according to this embodiment will next be described in the order of the steps thereof based on FIGS. 1 to 18.

Figure 2:
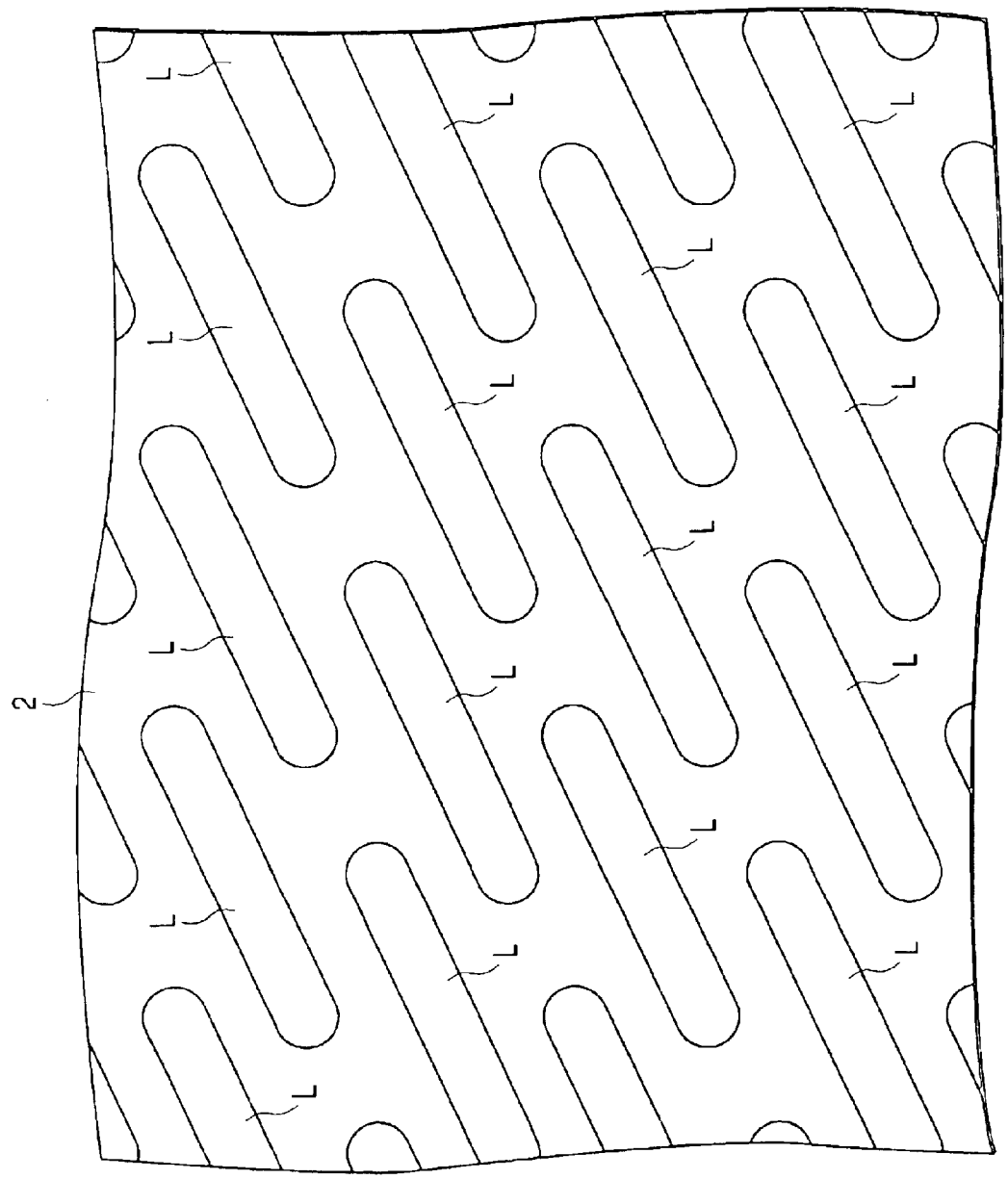
FIG. 2 is a fragmentary plane view of a semiconductor substrate illustrating a step in the method of manufacture of a semiconductor integrated circuit device according to Embodiment 1 of the present invention.

As illustrated in FIG. 1, an element isolation 2 was formed in an element isolation region on the principal surface of a semiconductor substrate 1, which is made of, for example, p-type single crystal silicon. Simultaneously with the formation of the element isolation 2, elongate island-shaped active regions (L), as illustrated in FIG. 2, that are surrounded at the periphery thereof with the element isolation 2, are formed. In each of these active regions (L), two memory cell selecting MISFETQs, having, in common, one of a source and a drain, are formed.

The element isolation 2 is formed in the following manner. The surface of the semiconductor substrate 1 is etched to form a groove of about 300 to 400 nm deep, and then a thin silicon oxide film is formed therein. After deposition of a silicon oxide film 4 (about 600 nm thick) by CVD (Chemical Vapor Deposition) over the semiconductor substrate 1 including the inside of this groove, the silicon oxide film 4 is polished back by chemical mechanical polishing (CMP), whereby the element isolation 2 is formed.

By ion implantation of B (boron) into the semiconductor substrate 1, a p-type well 3 is formed. After washing the surface of the p-type well 3 with an HF (hydrofluoric acid) washing liquid, the semiconductor substrate 1 is thermally oxidized, whereby a gate insulating film 5 of about 6 nm thick is formed on the surface of the p-type well 3 (active region L).

Figure 3:
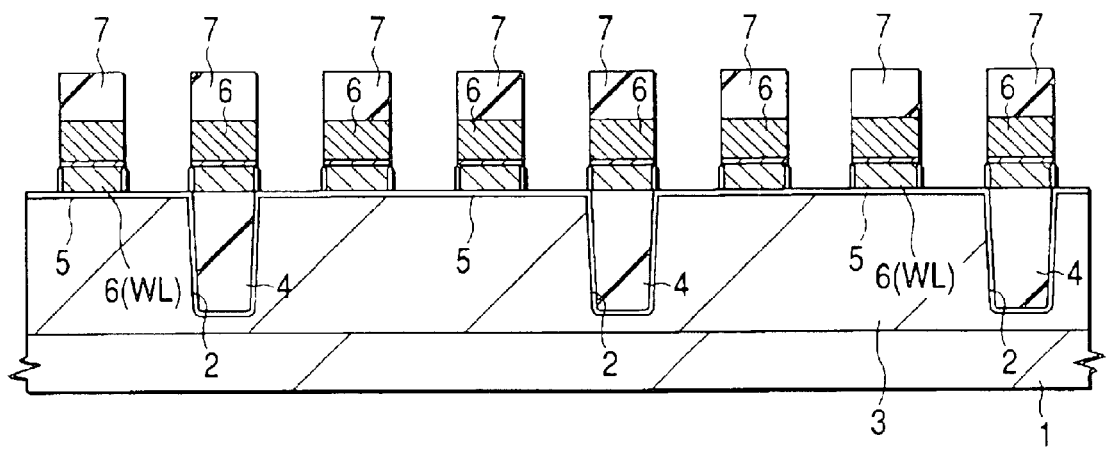
FIG. 3 is a fragmentary cross-sectional view of a semiconductor substrate illustrating a step in the method of manufacture of a semiconductor integrated circuit device according to Embodiment 1 of the present invention.

As illustrated in FIG. 3, a gate electrode 6 is formed over the gate insulating film 5. The gate electrode 6 is formed by successively depositing, for example, an n-type polycrystalline silicon film (about 70 nm thick) having P (phosphorous) doped therein, a barrier metal film (about 5 nm to 10 nm thick) made of WN (tungsten nitride) or TiN (titanium nitride), a W film (tungsten film, about 100 nm thick) and a silicon nitride film 7 (about 150 nm thick) over the gate insulating film 5, followed by dry etching of these films using a photoresist film (not illustrated) as a mask. The polycrystalline silicon film and silicon nitride film 7 are deposited by CVD, while the barrier metal film and W film are deposited by sputtering. The gate electrode 6 functions as a word line (WL). Wet hydrogen oxidation is then carried out to form a thin silicon oxide film over the side walls of the n-type polycrystalline silicon film constituting the gate electrode 6. By this wet hydrogen oxidation, an oxide film can be formed selectively over silicon.

Figure 4:
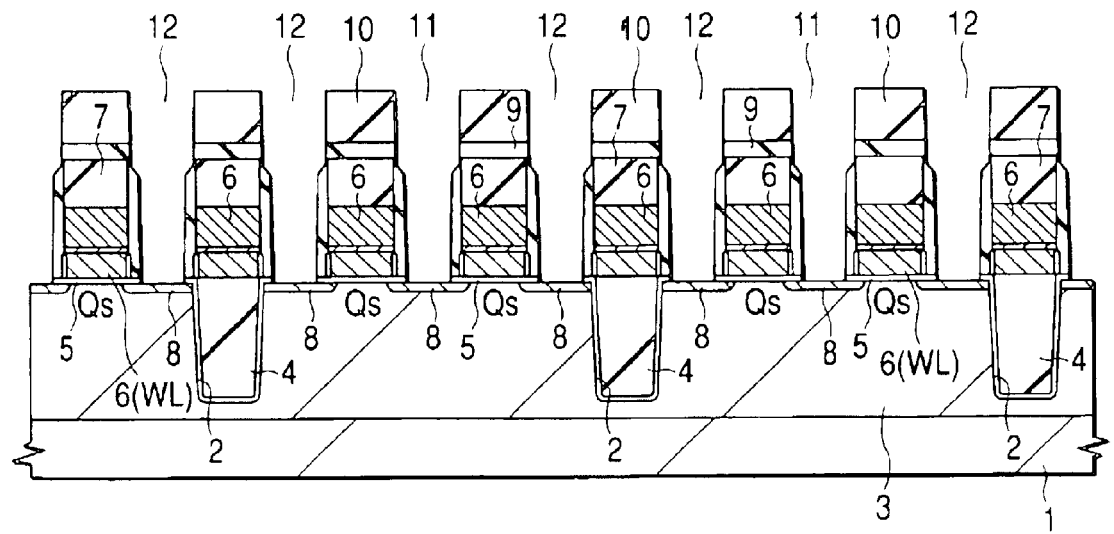
FIG. 4 is a fragmentary cross-sectional view of a semiconductor substrate illustrating a step in the method of manufacture of a semiconductor integrated circuit device according to Embodiment 1 of the present invention.

By ion implantation of As (arsenic) or P (phosphorous) to the p-type well 3, n-type semiconductor regions 8 (source, drain) are formed, as illustrated in FIG. 4, in the p-type well 3 existing on both sides of the gate electrode 6. By the steps so far described, formation of a memory cell selecting MISFETQs is substantially completed.

A silicon nitride film 9 (50 nm thick) and a silicon oxide film 10 (about 600 nm thick) are then deposited by CVD over the semiconductor substrate 1. After planarization of the surface of the silicon oxide film 10 by chemical mechanical polishing, the silicon oxide film 10 and silicon nitride film 9 are dry etched using a photoresist film (not illustrated) as a mask, whereby contact holes 11,12 are formed over the n-type semiconductor regions 8 (source, drain) of the memory cell selecting MISFETQs. The etching of the silicon oxide film 10 is carried out under conditions of a higher etching selectivity relative to the silicon nitride film, while etching of the silicon nitride film 9 is conducted under conditions of a higher etching selectivity relative to silicon or the silicon oxide film. By the above-described dry etching, the contact holes 11,12 are formed in self alignment with the gate electrode 6 (word line).

Figure 5:
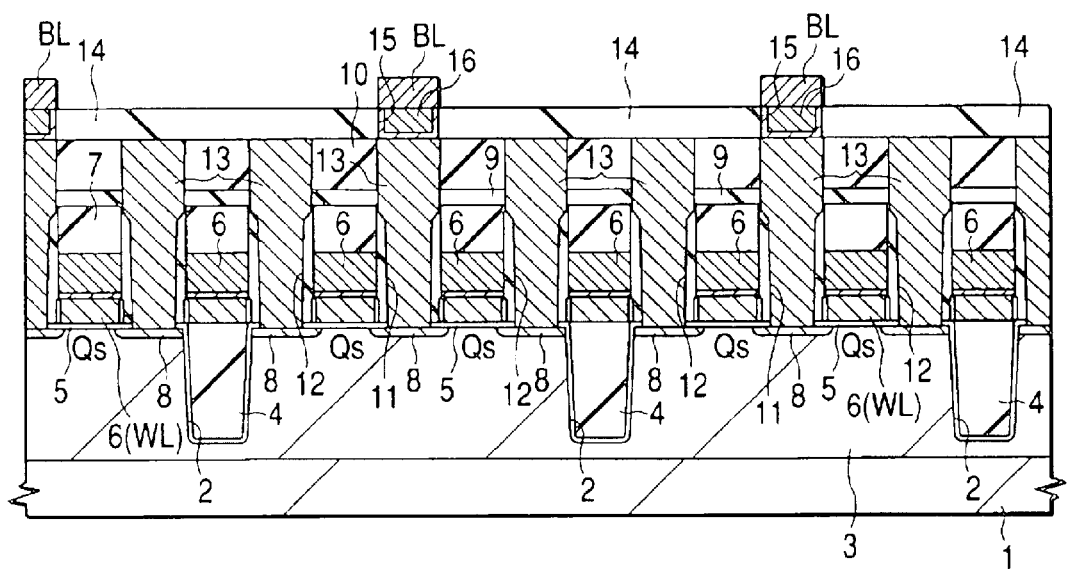
FIG. 5 is a fragmentary cross-sectional view of a semiconductor substrate illustrating a step in the method of manufacture of a semiconductor integrated circuit device according to Embodiment 1 of the present invention.

As illustrated in FIG. 5, a plug 13 is formed inside of the contact holes 11,12. This plug 13 is formed by depositing an n-type polycrystalline silicon film, which has been doped with P (phosphorous), over the silicon oxide film 10 by CVD, thereby embedding this n-type polycrystalline silicon film inside of the contact holes 11,12 and then removing the n-type polycrystalline silicon film from the outside of the contact holes 11,12 by chemical mechanical polishing (or by etch back). Impurities (phosphorous) in the plug 13 are then heat treated to diffuse them in the n-type semiconductor regions 8 (source, drain), whereby a contact resistance of the n-type semiconductor regions 8 (source, drain) with the plug 13 is reduced.

After deposition of a silicon oxide film 14 (about 150 nm thick) over the silicon oxide film 10 by CVD, the silicon oxide film 14 over the contact hole 11 is dry etched using a photoresist film (not illustrated) as a mask, whereby a through-hole 15 is formed. A plug 16 is then formed inside of the through-hole 15. This plug 16 is formed, for example, by depositing a barrier metal film, made of a laminate of a Ti film and a TiN film, by sputtering, depositing a W film by CVD over the barrier metal film, thereby embedding these films inside of the through-hole 15 and removing these films from the outside of the through-hole 15, by chemical mechanical polishing. Via these plugs 16 and 13, the n-type semiconductor regions 8 (source, drain) of the memory cell selecting MISFETQs and a bit line, which will be described later, are connected.

A bit line BL is then formed over the silicon oxide film 14 and plug 16. This bit line BL is formed, for example, by depositing a TiN film (about 10 nm thick, not illustrated) over the silicon oxide film 14 by sputtering, depositing a W film (about 50 nm thick) over the TiN film by CVD and then dry etching these films using a photoresist film (not illustrated) as a mask.

Figure 6:
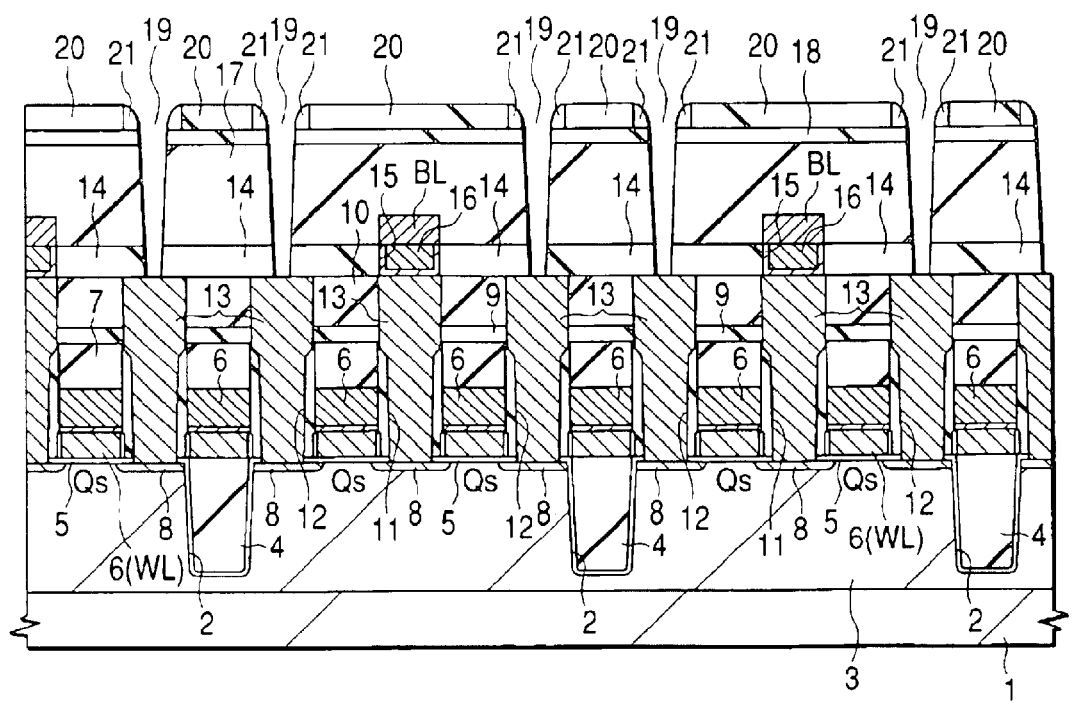
FIG. 6 is a fragmentary cross-sectional view of a semiconductor substrate illustrating a step in the method of manufacture of a semiconductor integrated circuit device according to Embodiment 1 of the present invention.

As illustrated in FIG. 6, a silicon oxide film 17 (about 300 nm thick) is deposited over the bit line BL by CVD, followed by planarization of the surface of the film by chemical mechanical polishing. Over the silicon oxide film 17, a silicon nitride film 18 (about 50 nm thick) is then deposited by CVD.

The silicon nitride film 18 and silicon oxide film 17 are dry etched, whereby a through-hole 19 is formed over the contact hole 12 having the plug 13 embedded therein.

The through-hole 19 is formed to have a smaller diameter than the diameter of the contact hole 12 lying thereunder. In this case, the diameter of the through-hole 19 is adjusted to about 0.1 $\mu$m. More specifically, a polycrystalline silicon film 20 is deposited over the silicon nitride film 18 by CVD, followed by dry etching of the polycrystalline silicon film 20 from a region wherein the through-hole 19 is to be formed, whereby a hole (about 0.18 $\mu$m in diameter) is formed. Over the polycrystalline silicon film 20, another polycrystalline silicon film (not illustrated) is deposited. The other polycrystalline silicon film over the polycrystalline silicon film 20 is anisotropically etched, whereby side wall spacers 21 are formed over the side walls of the hole. Then, using the polycrystalline silicon film 20 and side wall spacers 21 as hard masks, the silicon nitride film 18 and silicon oxide films 17,14 are dry etched from the bottom surface of the hole.

Figure 7:
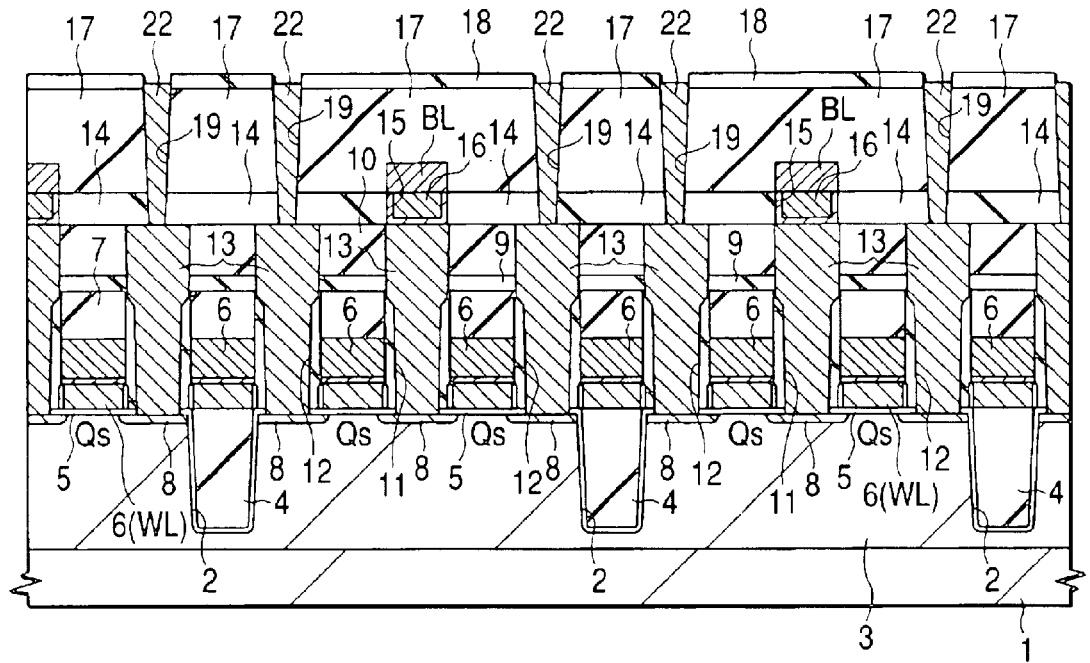
FIG. 7 is a fragmentary cross-sectional view of a semiconductor substrate illustrating a step in the method of manufacture of a semiconductor integrated circuit device according to Embodiment 1 of the present invention.

After removal of the polycrystalline silicon film 20 and side wall spacers 21 by dry etching, a plug 22 is formed inside of the through-hole 19, as illustrated in FIG. 7. This plug 22 is formed by depositing an n-type polycrystalline silicon film having P doped therein over the silicon nitride film 18 by CVD, thereby embedding the n-type polycrystalline silicon film inside of the through-hole 19, and then removing the n-type polycrystalline silicon film from the outside of the through-hole 19 by chemical mechanical polishing (or by etch back). At this time, the polycrystalline silicon film is over-polished (or over-etched) to make the surface height of the plug 22 lower than the upper end portion of the through-hole 19.

Figure 8:
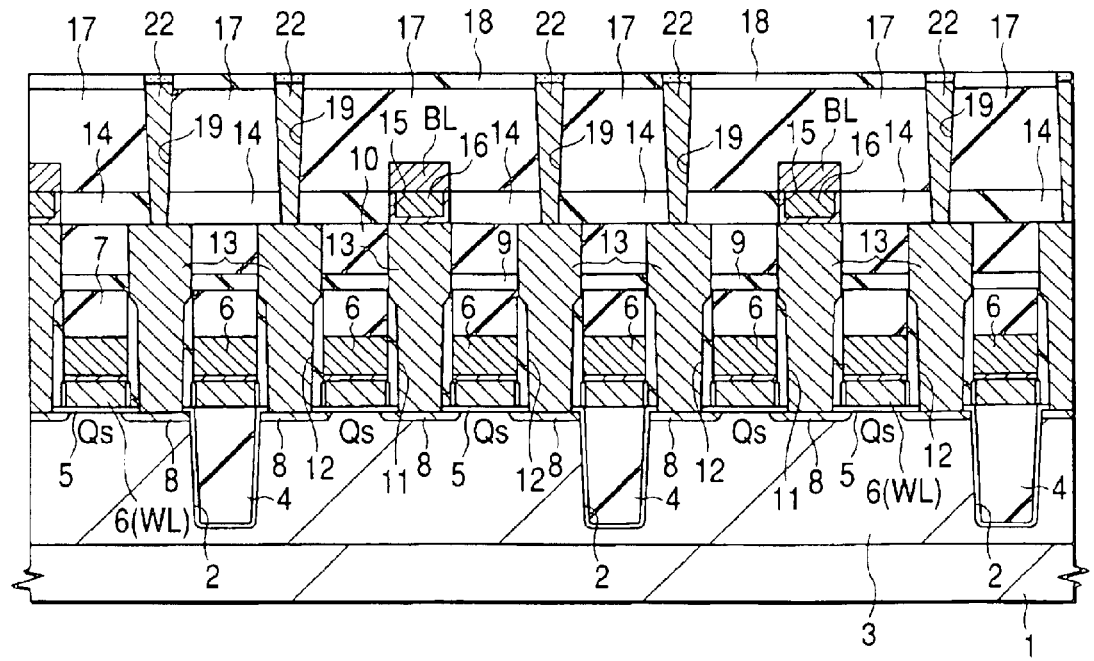
FIG. 8 is a fragmentary cross-sectional view of a semiconductor substrate illustrating a step in the method of manufacture of a semiconductor integrated circuit device according to Embodiment 1 of the present invention.

As illustrated in FIG. 8, a barrier layer 23 is then formed over the plug 22. This barrier layer 23 is formed by depositing a WN film over the silicon nitride film 18 by sputtering and then removing the WN film outside of the through-hole 19 by chemical mechanical polishing (or by dry etching). The barrier layer 23 is formed to prevent occurrence of an undesired silicide reaction between Ru (ruthenium) constituting the lower electrode 30A and the polycrystalline silicon constituting the plug 22. This barrier layer 23 may be formed of a W film or a TaN (tantalum nitride) film.

Over the plug 22, an information storage capacitive element (capacitor) C, having a lower electrode 30A made of an Ru film 20, a capacitive insulating film made of a tantalum oxide film 32 and an upper electrode 33 made of a W film/Ru film, is then formed.

The steps for formation of this information storage capacitive element C will be described next more specifically with reference to FIGS. 9 to 17. These drawings are schematic views illustrating a region over the plug 22 wherein the information storage capacitive element (capacitor) C is to be formed.

Figure 9:
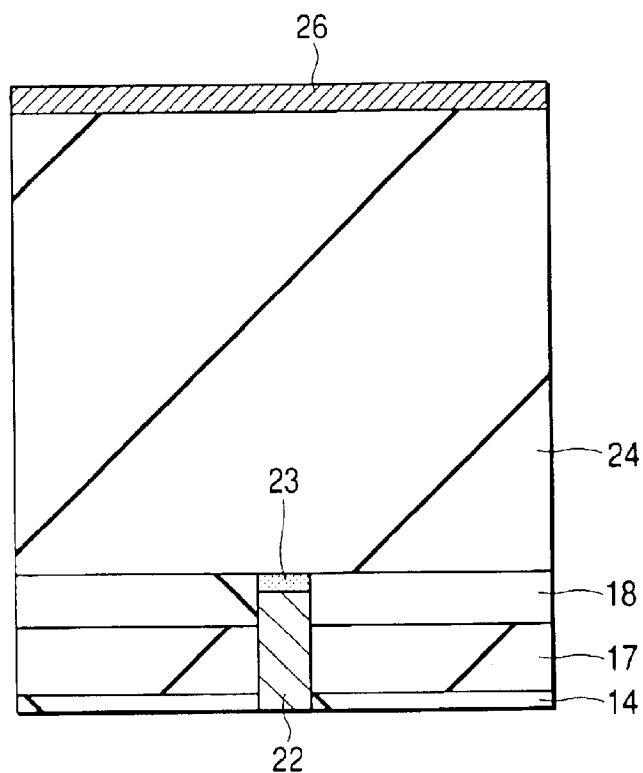
FIG. 9 is a fragmentary cross-sectional view of a semiconductor substrate illustrating a step in the method of manufacture of a semiconductor integrated circuit device according to Embodiment 1 of the present invention.

As illustrated in FIG. 9, a silicon oxide film 24 is deposited over the barrier layer 23 and silicon nitride film 18. A lower electrode of the information storage capacitive element C will be formed inside of a hole (recess) to be formed in the silicon oxide film 24. It is necessary to deposit the silicon oxide film 24 so as to form a thick film (about 0.8 $\mu$m) in order to increase the surface area of the lower electrode, thereby raising the storage charge amount. This silicon oxide film 24 is deposited, for example, by plasma CVD using oxygen and tetraethoxysilane (TEOS) as source gases, and then its surface is planarized by chemical mechanical polishing as needed.

Over the silicon oxide film 24, a W film of about 200 nm thick is then deposited by sputtering. An antireflective film is then applied to the upper portion of the W film, whereby a hard mask 26 is formed. The etching selectivity of the silicon oxide film 24 relative to this hard mask 26 (W film) is higher than that of a photoresist film, so that the hard mask is used as a mask upon etching of the thick silicon oxide film 24.

Figure 10:
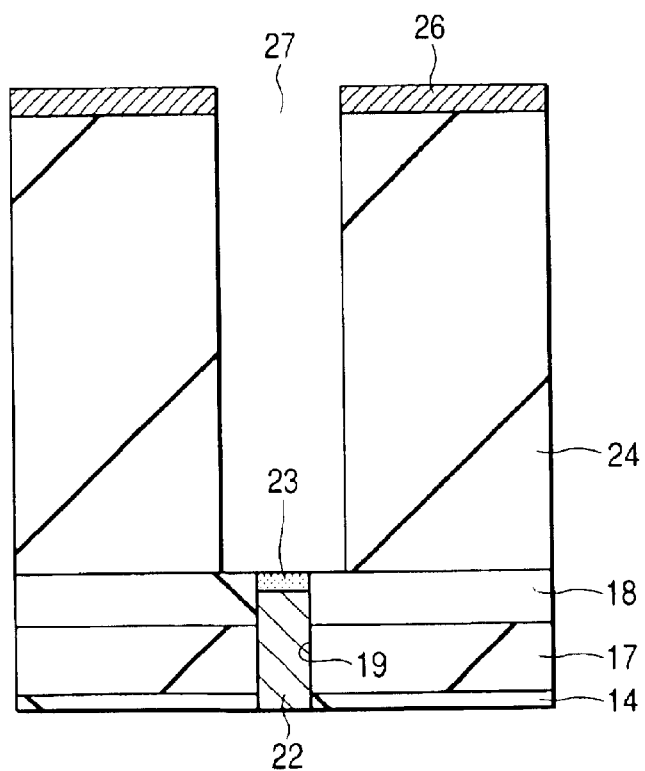
FIG. 10 is a fragmentary cross-sectional view of a semiconductor substrate illustrating a step in the method of manufacture of a semiconductor integrated circuit device according to Embodiment 1 of the present invention.

As illustrated in FIG. 10, a photoresist film (not illustrated) is formed over the hard mask 26. Using this photoresist film as a mask, the hard mask 26 is dry etched. The silicon oxide film 24 is dry etched using the hard mask 26 as a mask, whereby a deep hole (recess) 27 is formed. At the bottom of the deep hole (recess) 27, the surface of the barrier layer 23 in the through-hole 19 is exposed.

Figure 11:
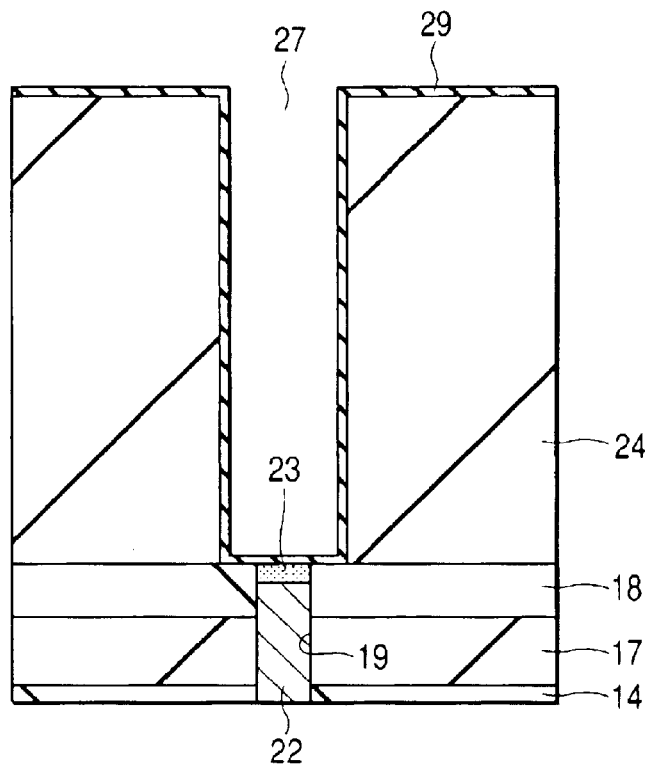
FIG. 11 is a fragmentary cross-sectional view of a semiconductor substrate illustrating a step in the method of manufacture of a semiconductor integrated circuit device according to Embodiment 1 of the present invention.

After removal of the hard mask 26, which has remained over the silicon oxide film 24, by using a solution containing aqueous hydrogen peroxide, a WN film 29 (about 15 nm thick) is deposited by sputtering over the silicon oxide film 24 and inside of the hole 27, as illustrated in FIG. 11. This WN film 29 is used as an adhesive layer because of the excellent adhesion it achieves with the underlying silicon oxide film 24 or an Ru film 30 which will be described later. If the adhesion of the silicon oxide film 24 with the Ru film 30 is secured by adopting a proper film formation method or proper conditions for the Ru film 30, which will be described later, the steps for formation of this adhesive layer can be omitted.

Figure 12:
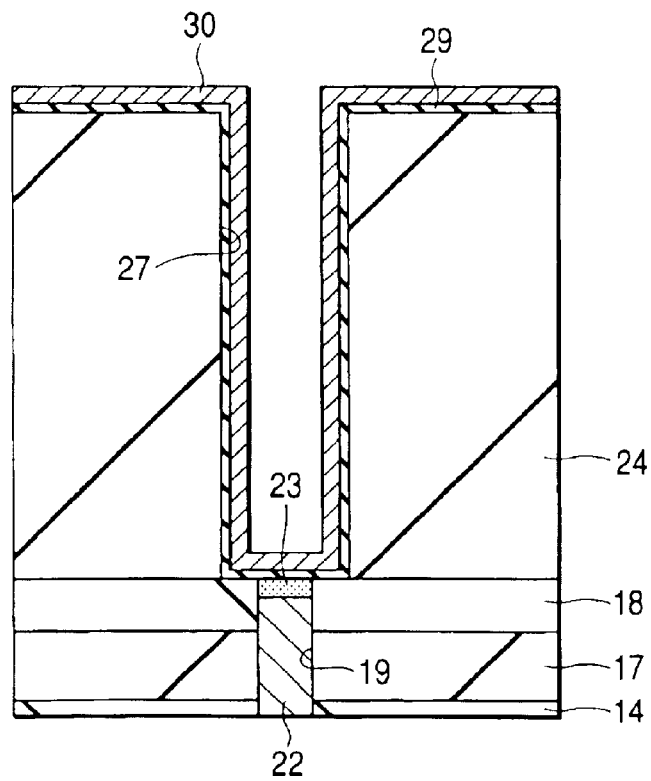
FIG. 12 is a fragmentary cross-sectional view of a semiconductor substrate illustrating a step in the method of manufacture of a semiconductor integrated circuit device according to Embodiment 1 of the present invention.

As illustrated in FIG. 12, the Ru film 30 (about 30 nm thick) is deposited by CVD over the WN film 29. Prior to deposition of the Ru film by CVD, an Ru film (not illustrated) of about 15 nm thick is formed by sputtering. The film formed by sputtering serves as a seed for efficient growth of the Ru film 30 by CVD.

This Ru film 30 can be formed by CVD by using, for example, a tetrahydrofuran solution of ethylcyclopentadienylruthenium $(Ru(C_2H_5C_5H_4)_2)$ and $O_2$ (oxygen) as raw materials. Alternatively, it can be formed using $Ru(HFAC)_3$, which is a complex compound of Ru and hexafluoroacetylacetone $(CF_3COCH_2COCF_3)$, $H_2O$ (water vapor) and $H_2$ (hydrogen) as raw materials. The term "HFAC" means $(CF_3COCH_2COCF_3)^-$. Then, in a nitrogen gas atmosphere, the Ru film 30 is densified by heat treatment at 700° C. for 1 minute.

Figure 13:
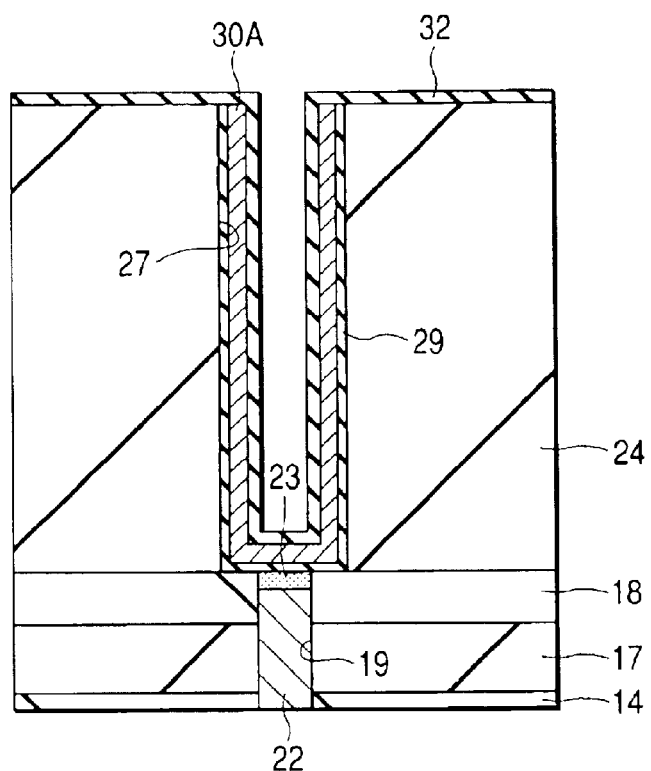
FIG. 13 is a fragmentary cross-sectional view of a semiconductor substrate illustrating a step in the method of manufacture of a semiconductor integrated circuit device according to Embodiment 1 of the present invention.

As illustrated in FIG. 13, a photoresist film (not illustrated) is applied to the Ru film 30, followed by whole surface exposure and development, whereby the photoresist film (not illustrated) is left in the hole 27. In the subsequent step for removing an unnecessary portion of the Ru film 30 over the silicon oxide film 24 by dry etching, this photoresist film serves as a film for protecting the Ru film 30 from being removed from the inside (on the side walls and bottom surface) of the hole 27. By dry etching using this photoresist film as a mask, the Ru film 30 over the silicon oxide film 24 is removed, whereby a lower electrode 30A is formed. Then, the photoresist film is removed from the inside of the hole 27.

Inside of the hole 27, having the lower electrode 30A formed therein, and over the silicon oxide film 24, a tantalum oxide film 32 of about 10 nm thick is deposited, which will serve as a capacitive insulating film (capacitor insulating film). This tantalum oxide film 32 is deposited by CVD using pentaethoxytantalum $(Ta(OC_2H_5)_5)$ and oxygen as raw materials.

Figure 14:
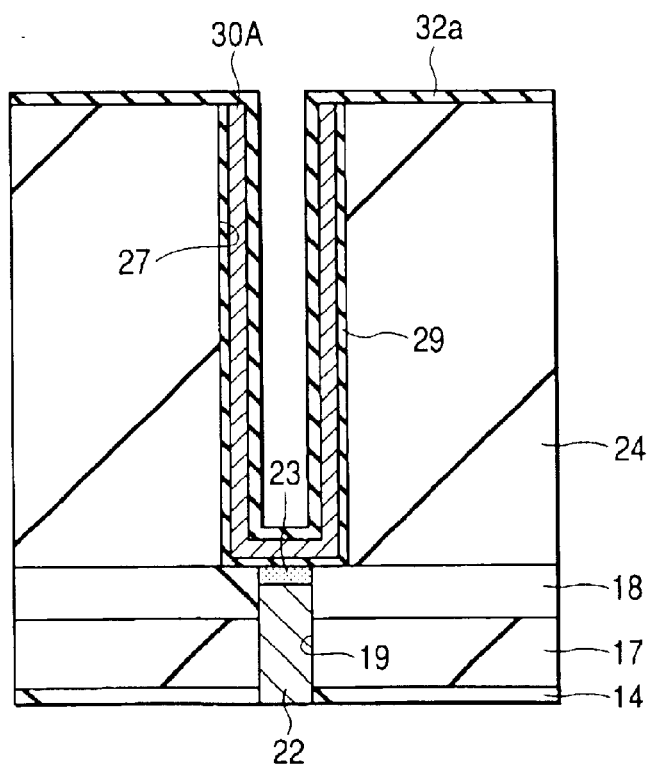
FIG. 14 is a fragmentary cross-sectional view of a semiconductor substrate illustrating a step in the method of manufacture of a semiconductor integrated circuit device according to Embodiment 1 of the present invention.

The tantalum oxide film 32 deposited by CVD is in the amorphous form, and, therefore, it becomes a cause for increasing leakage current. In order to improve the quality of the tantalum oxide film 32, it is heat treated (annealed). By this heat treatment, the tantalum oxide film 32 is crystallized and becomes a tantalum oxide film 32a (FIG. 14). This heat treatment is also effective for repairing the defects in the tantalum oxide film, thereby reducing the leakage current.

This heat treatment is carried out in a mixed gas atmosphere of $H_2O$ (water vapor) and $H_2$ (hydrogen), for example, at 700° C.

As described above, in this Embodiment, heat treatment for improving the quality of the tantalum oxide film 32 is conducted in a mixed gas atmosphere of $H_2O$ and $H_2$ so that oxidation of a metal layer (for example, lower electrode (Ru), WN film (adhesive layer) or barrier layer (WN film)) lying under the tantalum oxide film 32 can be prevented by controlling the partial pressure ratio of this $H_2O$ to $H_2$.

The control of this partial pressure ratio of $H_2O$ to $H_2$ ($[H_2O]/[H_2]$) will be explained next.

Figure 15:
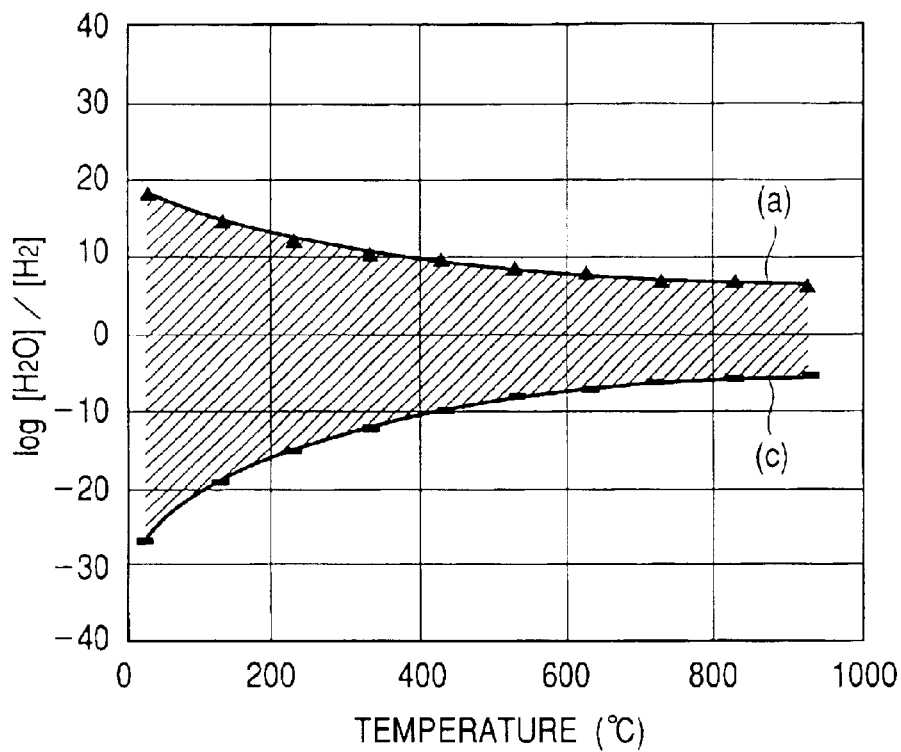
FIG. 15 is a graph which illustrates a partial pressure ratio of $H_2O$ to $H_2$ upon heat treatment of a tantalum oxide film.

FIG. 15 is a graph illustrating at curve (a) the logarithm of the equilibrium constant k under the equilibrium of System 1 ($RuO_2+H_2$) and System 2 ($Ru+H_2O$) plotted as a function of the reaction temperature. It is expressed by log k=log $[[H_2O]_{eq1}/[H_2]_{eq1}]$, wherein $[H_2O]_{eq1}$ stands for a partial pressure of $H_2O$ under the equilibrium and $[H_2]_{eq1}$ stands for a partial pressure of $H_2$ under the equilibrium.

FIG. 15 illustrates at curve (c) the logarithm of the equilibrium constant k under the equilibrium of System 1 ($Ta_2O_5+H_2$) and System 2 ($Ta+H_2O$) plotted as a function of reaction temperature. It is expressed by log k=log $[[H_2O]_{eq2}/[H_2]_{eq2}]$, wherein $[H_2O]_{eq2}$ represents a partial pressure of $H_2O$ under the equilibrium and $[H_2]_{eq2}$ represents a partial pressure of $H_2$ under the equilibrium. Such an equilibrium constant k can be determined from a difference ($\Delta G$) of the Gibbs free energy between System 1 and System 2.

Under the conditions permitting existence of the partial pressure ratio below this curve (c), the equilibrium moves in a direction to reduce $Ta_2O_5$, so that upon heat treatment of the tantalum oxide film 32, it is necessary to control the partial pressure ratio of $H_2O$ to $H_2$ falling within a region above the curve (c) of FIG. 15.

Under the conditions permitting existence of the partial pressure ratio above the curve (a) of FIG. 15, the equilibrium moves in a direction to oxidize Ru, so that upon heat treatment of the tantalum oxide film 32, it is necessary to control the partial pressure ratio of $H_2O$ to $H_2$ falling within a region below the curve (a) of FIG. 15.

Heat treatment of the tantalum oxide film 32, while controlling the partial pressure ratio of $H_2O$ to $H_2$ to lie in a region bounded by the curve (a) and curve (c) of FIG. 15 makes it possible to prevent oxidation of a lower electrode (Ru film) and, at the same time, to improve the quality of the tantalum oxide film 32. For example, when heat treatment is conducted at 700° C., the partial pressure ratio of $H_2O$ to $H_2$ ($\log\{[H_2O]/[H_2]\}$) becomes $-6.71<\log\{[H_2O][H_2]\}<6.98$.

Heat treatment at 500° C. or greater is preferred for crystallization of the tantalum oxide film 32.

According to this embodiment, heat treatment for improving the quality of the tantalum oxide film 32 is conducted in a mixed gas atmosphere of $H_2O$ and $H_2$ under conditions such that the partial pressure ratio of $H_2O$ to $H_2$ ($[H_2O]/[H_2]$) will be greater than ($[H_2O]_{eq1}/[H_2]_{eq1}$), but smaller than ($[H_2O]_{eq2}/[H_2]_{eq2}$), at the corresponding heat treatment temperature. Therefore, it is possible to improve the quality of the tantalum oxide film 32. while preventing oxidation of a lower electrode (Ru film).

This makes it possible to reduce the volumetric expansion which will otherwise occur during this heat treatment owing to oxidation of the lower electrode (Ru film), thereby preventing breakage of the tantalum oxide film 32a. In addition, the amount of oxygen in the lower electrode (Ru film) can be reduced, resulting in suppression of a dispersion amount of this oxygen in the lower electrode 30A (Ru film), in the WN film 29 (adhesive layer) and in the barrier layer 23 (WN film), each lying below the tantalum oxide film 32. Accordingly, a conduction failure, which will otherwise be caused by an oxide film formed at these sites, can be reduced. This heat treatment is particularly effective when applied to a minute semiconductor device having a small-diameter plug 22 as in this embodiment.

Figure 16:
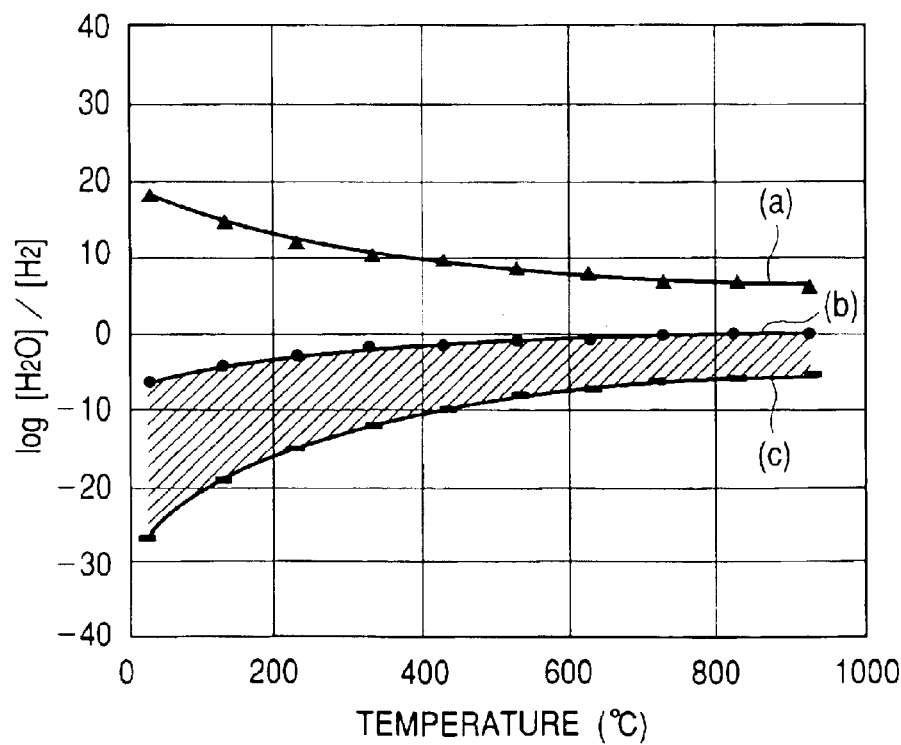
FIG. 16 is a graph which illustrates a partial pressure ratio of $H_2O$ to $H_2$ upon heat treatment of a tantalum oxide film.

FIG. 16 is a graph illustrating at the curve (b) the logarithm of the equilibrium constant k under the equilibrium of System 1 ($WO_2+H_2$) and System 2 ($W+H_2O$) plotted as a function of reaction temperature. The curve (b) lies below the above-described curve (a). As described above, it is expressed by log k=log $[[H_2O]_{eq13}/[H_2]_{eq3}]$, wherein $[H_2O_{eq3}]$ stands for a partial pressure of $H_2O$ under the equilibrium and $[H_2]_{eq3}$ stands for a partial pressure of $H_2$ under the equilibrium. Such an equilibrium constant k can be determined from a difference ($\Delta G$) of the Gibbs free energy between System 1 and System 2.

Heat treatment of the tantalum oxide film 32, while controlling the partial pressure ratio of $H_2O$ to $H_2$ to cause it to lie in a region bounded by the curve (b) and curve (c) of FIG. 16, makes it possible to prevent oxidation of the lower electrode (Ru film) or the WN film and, at the same time, to improve the quality of the tantalum oxide film 32. For example, when heat treatment is conducted at 700° C., the partial pressure ratio of $H_2O$ to $H_2$ ($\log\{[H_2O]/[H_2]\}$) becomes $-6.71<\log\{[H_2O]/[H_2]\})<-0.6$.

This makes it possible to reduce the volumetric expansion which will otherwise occur during heat treatment owing to the oxidation of the lower electrode (Ru film), thereby preventing the breakage of the tantalum oxide film 32. In addition, the amount of oxygen in the lower electrode (Ru film) and WN films (29,23) can be decreased, resulting in a reduction in the conduction failure which will otherwise occur owing to an oxide film formed at these sites.

Figure 17:
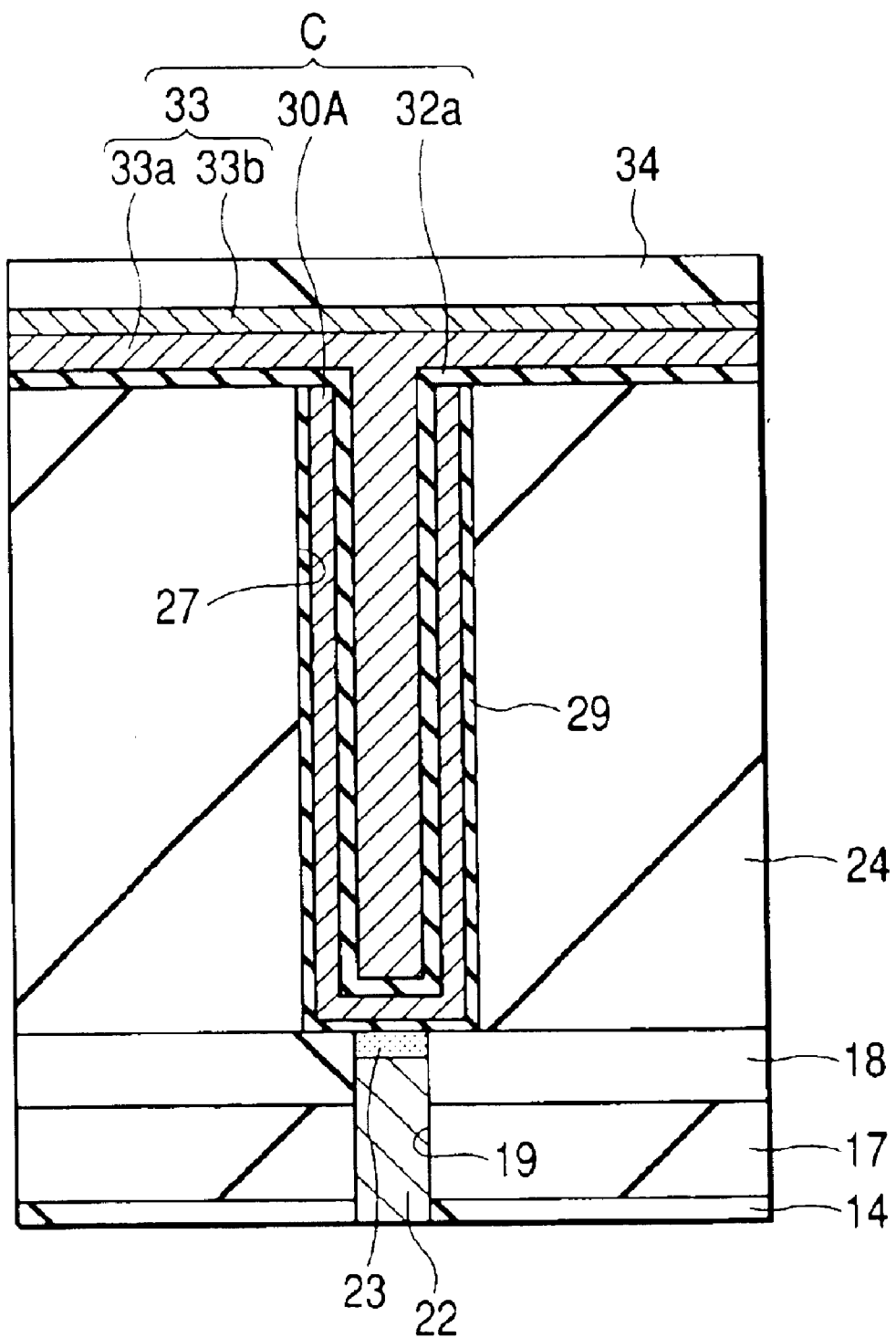
FIG. 17 is a fragmentary cross-sectional view of a semiconductor substrate illustrating a step in the method of manufacture of a semiconductor integrated circuit device according to Embodiment 1 of the present invention.

As illustrated in FIG. 17, an upper electrode 33 is formed over the tantalum oxide film 32. This upper electrode 33 is formed, for example, by depositing an Ru film 33a (about 70 nm thick) and a W film 33b (about 100 nm thick) over the tantalum oxide film 32 by CVD. The Ru film 33a and Ru film 30 are formed simultaneously. The W film 33b serves to reduce the contact resistance between the upper electrode 33 and upper interconnects.

Figure 18:
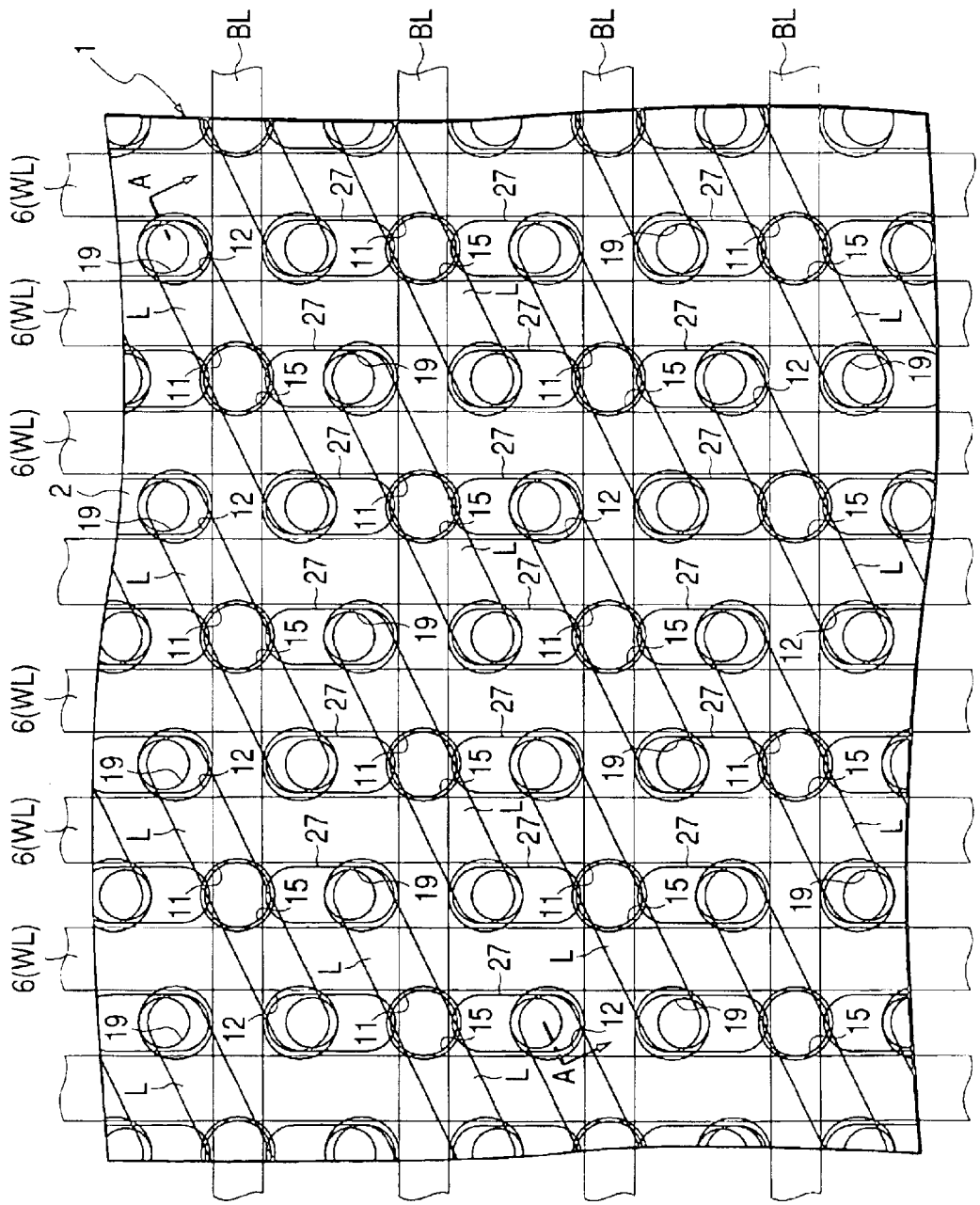
FIG. 18 is a fragmentary plane view of a semiconductor substrate illustrating a step in the method of manufacture of a semiconductor integrated circuit device according to Embodiment 1 of the present invention.

By the steps so far described, an information storage capacitive element C, having a lower electrode 30A made of the Ru film 30, a capacitive insulating film made of the tantalum oxide film 32 and an upper electrode 33 made of the W film 33b/Ru film 33a, is completed, and a memory cell of a DRAM, having memory cell selecting MISFETQs and the information storage capacitive element C connected in series therewith, is substantially completed. FIG. 18 is a plane view of a semiconductor integrated circuit device after formation of the information storage capacitive element C. FIG. 8 corresponds to, for example, a cross-sectional view taken along a line A—A of FIG. 18.

Over the information storage capacitive element C, an interlayer dielectric film 34 made of silicon oxide is formed. An Al interconnect made of about two layers is formed over the interlayer dielectric film. Over the Al interconnect, which forms the top layer, a passivation film is formed, but its illustration is omitted.

In this embodiment, as described above in detail, heat treatment for improving the quality of the tantalum oxide film 32 is conducted in a mixed atmosphere of $H_2O$ and $H_2$, so that oxidation of metal layers (such as lower electrode (Ru), WN film (adhesive layer) and barrier layer (WN film)) lying below the tantalum oxide film 32 can be prevented by controlling the partial pressure ratio of $H_2O$ to $H_2$.

Particularly when heat treatment of the tantalum oxide film 32 is carried out, while controlling the partial pressure ratio of $H_2O$ to $H_2$ within a region bounded by the curve (a) and the curve (c) of FIG. 15, it is possible to prevent oxidation of the lower electrode (Ru film), while improving the quality of the tantalum oxide film 32.

When heat treatment of the tantalum oxide film 32 is carried out, while controlling the partial pressure ratio of $H_2O$ to $H_2$ within a region bounded by the curve (b) and the curve (c) of FIG. 16, it is possible to improve the quality of the tantalum oxide film 32, while preventing oxidation of the lower electrode (Ru film) and WN film.

As a result, volumetric expansion, which will otherwise occur owing to oxidation of the lower electrode (Ru film) during heat treatment, can be reduced, thereby preventing breakage of the tantalum oxide film 32a. In addition, the amount of oxygen in the Ru film and WN film can be decreased, making it possible to reduce a conduction failure which will otherwise be caused by an oxide film formed at these sites.

Moreover, the properties of the information storage capacitive element C can be improved, and, as a result, the properties of the memory cell can be improved. In a miniaturized memory cell structure, a desired capacitance can be maintained.

In this embodiment, the lower electrode is formed using Ru, but, instead, a platinum group metal, such as Ir (iridium), Pd (palladium), Rh (rhodium) or Pt (platinum), or copper, may be used.

In this embodiment, a tantalum oxide film is used as the capacitive insulating film, but, instead, an oxide film, such as $Al_2O_3$, BST ($Ba_xSr_{1-x}TiO_3$), $TiO_2$, $HfO_2$, $ZrO_2$, $BaTiO_3$ or $SrTiO_3$, may be used.

In this embodiment, a WN film is used as the barrier layer, but, instead, TaN, TiN, TiW, W, MoN or Mo may be used.

When a tantalum oxide film is used as the capacitive insulating film and TaN is used as the barrier layer, it is considered difficult to carry out heat treatment for improving the quality of the tantalum oxide film, while at the same time preventing oxidation of the barrier layer (TaN film). With regards to Ti, TiN, Ta and TaN, these films containing Ti or Ta are easier to oxidize or equally easy to oxidize compared with Ta, so that when a tantalum oxide film is used as the capacitive insulating film, use of WN, W, MoN or Mo is preferred as the barrier layer.

Thus, a metal which is not easier to oxidize than the metal in the capacitive insulating film must be selected as needed and used as the barrier layer. Here, the term "not easier to oxidize" means that, in a graph as illustrated in FIG. 15, the curve of the metal in the capacitive insulating film lies below the curve of the metal in the barrier layer. This relationship also applies to not only the barrier layer, but also to the lower electrode or adhesive layer lying below the capacitive insulating film.

By selecting such a metal properly, the partial pressure ratio of $H_2O$ to $H_2$ during heat treatment in a mixed gas atmosphere of $H_2O$ and $H_2$ for improving the quality of the capacitive insulating film can be controlled to prevent oxidation of a metal layer (ex. lower electrode, adhesive layer or barrier layer) lying under the capacitive insulating film.

Embodiment 2

In Embodiment 1, the plug 22 is formed by embedding an n-type polycrystalline silicon film inside of the through-hole 19, and, then, the barrier layer 23 made of a WN film is formed over the plug. The plug and the barrier layer may each have a constitution as described below.

A method of manufacture of a DRAM according to this embodiment will be described next. The steps leading up to the formation of a through-hole 19 by dry etching of a silicon nitride film 18 and silicon oxide films 17,14 are similar to the steps of Embodiment 1, as described with reference to FIGS. 1 to 6, so that an overlapping description of these steps is omitted. In this embodiment, a description will be made with reference to a schematic view of an information storage capacitive element C to be formed in the vicinity of and over a plug formed inside of the through-hole 19.

Figure 19:
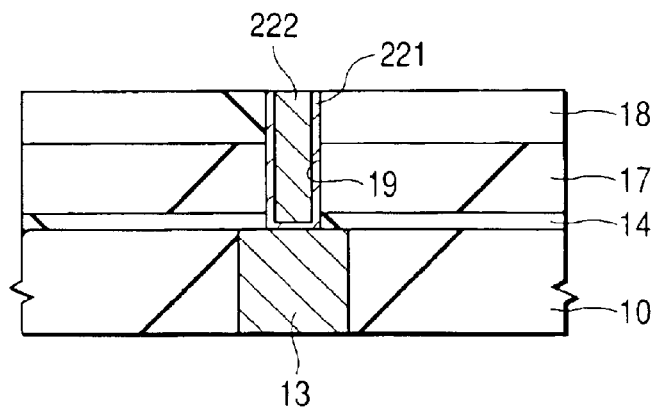
FIG. 19 is a fragmentary cross-sectional view of a semiconductor substrate illustrating a step in the method of manufacture of a semiconductor integrated circuit device according to Embodiment 2 of the present invention.

As illustrated in FIG. 19, a plug 222 is formed inside of the through-hole 19. This plug 222 is formed by depositing a barrier metal film 221 made of a laminate of a Ti film and a TiN film, for example, by sputtering over the silicon nitride film 18, including the inside of the through-hole 19, depositing a W film 222 over the barrier metal film by CVD, thereby embedding these films inside of the through-hole 19, and then removing these films from the outside of the through-hole 19 by chemical mechanical polishing. The through-hole 19 is formed in a silicon nitride film 18, a silicon oxide film 17 and a silicon oxide film 14, and, from its bottom, a plug 13 made of an n-type polycrystalline silicon film is exposed. The barrier metal film 221 serves to prevent the occurrence of an undesired silicide reaction between the W film constituting the plug 222 and the polycrystalline silicon constituting the plug 13.

Figure 20:
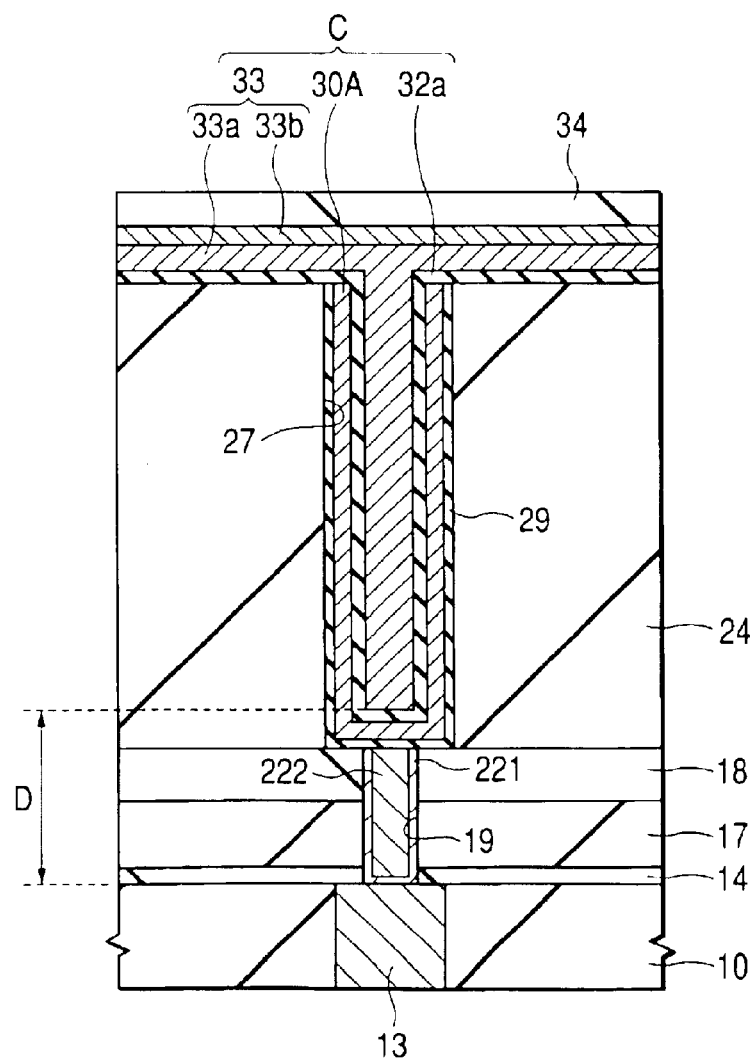
FIG. 20 is a fragmentary cross-sectional view of a semiconductor substrate illustrating a step in the method of manufacture of a semiconductor integrated circuit device according to Embodiment 2 of the present invention.

As illustrated in FIG. 20, an information storage capacitive element (capacitor) C having a lower electrode 30A made of an Ru film 30, a capacitive insulating film made of a tantalum oxide film 32 and an upper electrode 33 made of a W film/Ru film is formed over the plug 222. This information storage capacitive element C is formed in a similar manner to the steps of Embodiment 1, described with reference to FIGS. 9 to 17, so that a repeated explanation of these steps is omitted.

In this embodiment, as described in detail, heat treatment for improving the quality of the tantalum oxide film 32 is conducted as in Embodiment 1, so that oxidation of a metal layer (ex. lower electrode (Ru), WN film (adhesive layer) or barrier layer (WN film)) lying below the tantalum oxide film 32 can be prevented.

Moreover, the plug 222 is formed of a W film, making it possible to increase the distance D from the tantalum oxide film 32 to a silicon film (plug 13 in this case), thereby preventing oxidation of the silicon film.

In this embodiment, the distance D from the tantalum oxide film 32 to the surface of the plug 13 can be secured (FIG. 20). In Embodiment 1 (FIG. 17), on the other hand, the distance between the tantalum oxide film 32 to the surface of the silicon film (plug 22 in the case of FIG. 17) is not greater than D.

Since silicon (Si) is a metal which is easier to oxidize than a film (for example, lower electrode (Ru), WN film (adhesive layer, plug (W film) 222 or barrier layer (Ti film, TiN film)) sandwiched between the tantalum oxide film 32 and plug 13, oxygen incorporated at such a site diffuses throughout this site and binds with a metal (Si) which is oxidized most easily, bringing about stabilization.

On the interface between the silicon film and such a site, an oxide film tends to be formed. By the use of a W film for the plug 222 in this embodiment, however, the distance between the tantalum oxide film 32 to the silicon film (plug 13 in this case) can be increased, whereby oxidation of the silicon film can be prevented. As a result, in addition to the advantages as described in Embodiment 1, this embodiment makes it possible to reduce a conduction failure which may occur due to formation of an oxide film in the plug 13.

In this embodiment, the plug 222 is formed of a W film, but instead, WN, TaN, TiN, TiW, W, MoN or Mo may be used.

Embodiment 3

In Embodiment 2, a W film is used for forming the plug 222. However, Si may be incorporated in this plug 222.

A description will be given of a method of manufacture of a DRAM according to this embodiment. The steps of this embodiment, other than those involved in the formation of a plug 322, are similar to the steps of Embodiment 2 and the steps of Embodiment 1 incorporated in Embodiment 2 , so that an overlapping description of such steps is omitted.

Figure 21:
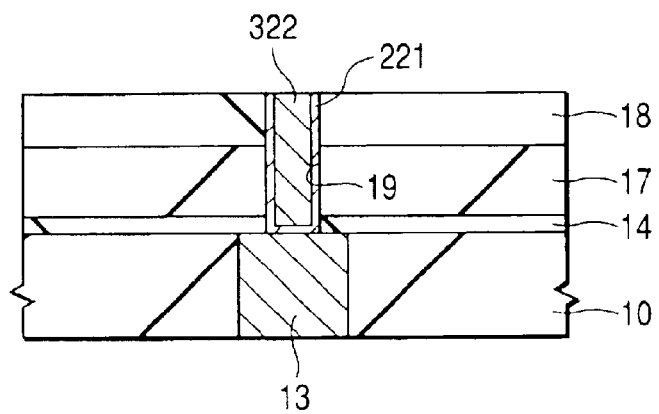
FIG. 21 is a fragmentary cross-sectional view of a semiconductor substrate illustrating a step in the method of manufacture of a semiconductor integrated circuit device according to Embodiment 3 of the present invention.

As illustrated in FIG. 21, a barrier metal film 221 made of a laminate of a Ti film and a TiN film, is deposited over the silicon nitride film 18, including the inside of the through-hole 19, for example, by sputtering, followed by deposition of a W film over the barrier metal film 221 by CVD. At this time, film formation is conducted by CVD using $SiH_4$ and $WF_6$ as raw materials in order to incorporate Si in the W film. The content of this Si is set at 50% or less. These films are removed from the outside of the through-hole 19 by chemical mechanical polishing, whereby the plug 322 is formed.

Figure 22:
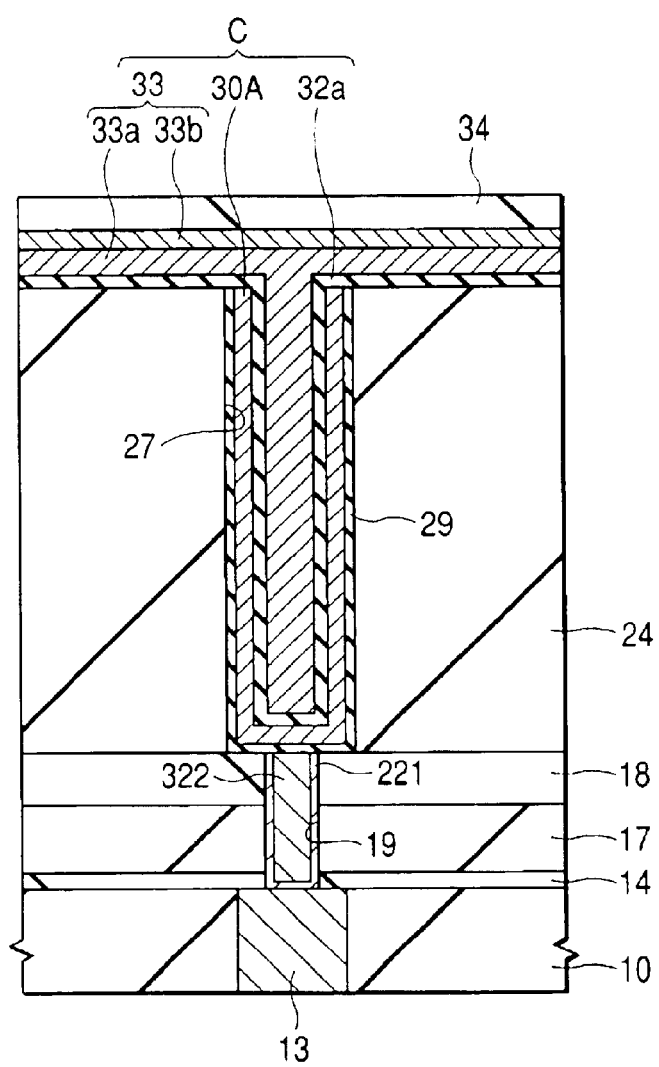
FIG. 22 is a fragmentary cross-sectional view of a semiconductor substrate illustrating a step in the method of manufacture of a semiconductor integrated circuit device according to Embodiment 3 of the present invention.

As illustrated in FIG. 22, an information storage capacitive element (capacitor) C having a lower electrode 30A made of an Ru film 30, a capacitive insulating film made of a tantalum oxide film 32 and an upper electrode 33 made of a W film/Ru film is then formed over the plug 322.

According to this embodiment, heat treatment for improving the quality of the tantalum oxide film 32 is conducted as in Embodiment 1 so that oxidation of a metal layer (for example, lower electrode (Ru), WN film (adhesive layer) or a barrier layer (WN film)) lying below the tantalum oxide film 32 can be prevented.

Since the plug 322 is formed of an Si-containing W film, even if oxygen or a compound of oxygen diffuses in the plug 322, Si in the W film can trap this oxygen, thereby preventing oxidation of the W film. Si exists in the W film in the dotted form, so even if it traps oxygen and forms its oxide, it does not take a film form, making it possible to secure conduction of the plug 322. As a result, in addition to the advantage as described in Embodiment 1, conduction failure of the plug 322 can be reduced.

In this embodiment, for the formation of the plug 322, a W film is used, but, instead, WN, TaN, TiN, TiW, W, MoN or Mo may be used.

As a trapping metal, a metal that is easily oxidized, such as Al, Hf, Zr or Ti, may be used instead of Si.

Since whether a metal is easy to oxidize or not is determined relatively, a metal which is easier to oxidize than a metal constituting the plug 322 may be used as a trapping metal.

Embodiment 4

In Embodiments 1 to 3, heat treatment for crystallizing the tantalum oxide film is conducted in a mixed gas atmosphere of $H_2O$ and $H_2$ while controlling the partial pressure ratio of $H_2O$ to $H_2$. Alternatively, heat treatment of the tantalum oxide film may be conducted in the following manner.

A description will be given of a method of manufacture of a DRAM according to this embodiment. Steps other than formation of a tantalum oxide film and heat treatment for improving the quality of the tantalum oxide film are carried out as in Embodiment 1, so that an overlapping explanation of such steps is omitted.

Figure 23:
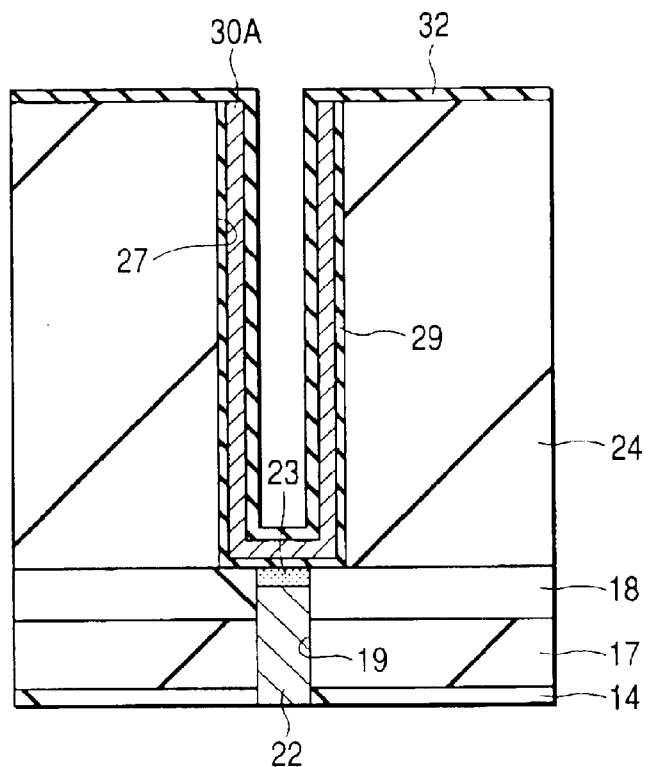
FIG. 23 is a fragmentary cross-sectional view of a semiconductor substrate illustrating a step in the method of manufacture of a semiconductor integrated circuit device according to Embodiment 4 of the present invention.

As illustrated in FIG. 23, a tantalum oxide film 32 of about 10 nm thick, which will serve as a capacitive insulating film, is deposited inside of a hole 27 having a lower electrode 30A, which is formed therein over a silicon oxide film 24. This tantalum oxide film 32 is deposited by CVD using pentaethoxytantalum ($Ta(OC_2H_5)_5$) and oxygen as raw materials.

The quality of the tantalum oxide film 32 deposited by CVD is improved by heat treatment (annealing) at 200 to 400° C. At the time the heat treatment of the tantalum oxide film 32 is carried out, the partial pressure ratio of $H_2O$ to $H_2$ is controlled so as to fall within a region corresponding to a temperature range of from 200 to 400° C., of the region bounded by the curve (a) and curve (c) of FIG. 15, as described with reference to Embodiment 1.

Figure 24:
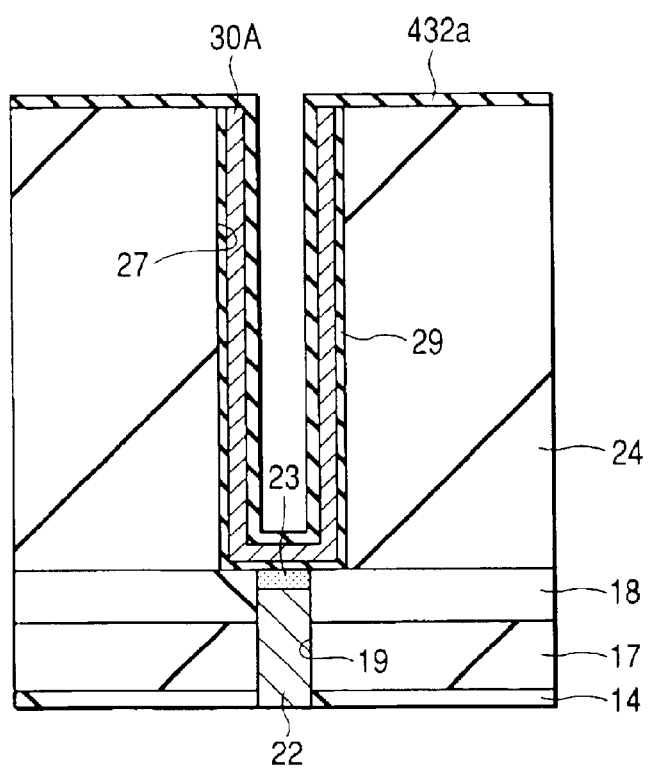
FIG. 24 is a fragmentary cross-sectional view of a semiconductor substrate illustrating a step in the method of manufacture of a semiconductor integrated circuit device according to Embodiment 4 of the present invention.

When the heat treatment is held within such a temperature range, crystallization of the tantalum oxide film does not occur, but the leakage current can be made lower than that of the tantalum oxide film before heat treatment and its film quality can be improved. The tantalum oxide film after heat treatment is designated as 432a (FIG. 24).

Figure 25:
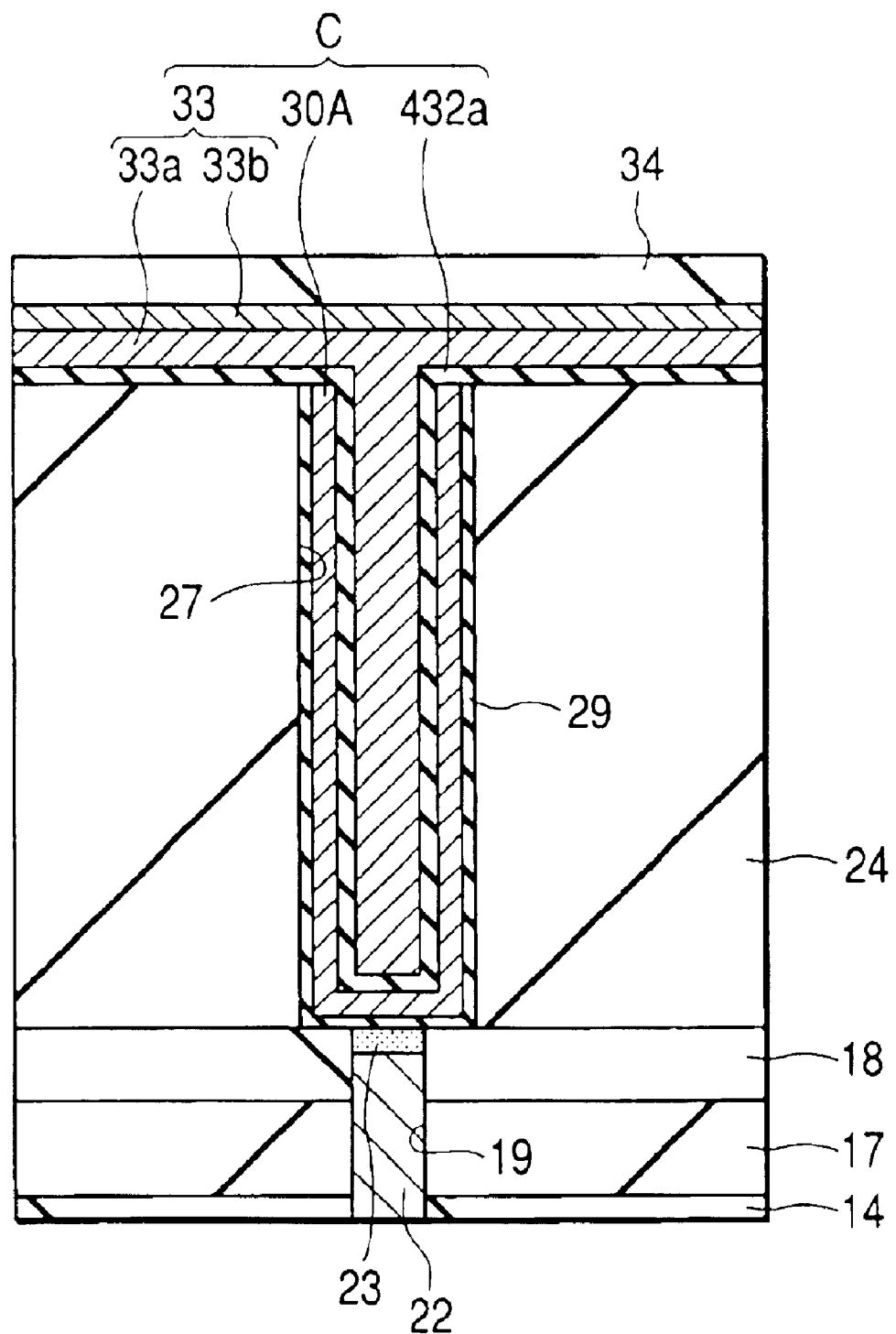
FIG. 25 is a fragmentary cross-sectional view of a semiconductor substrate illustrating a step in the method of manufacture of a semiconductor integrated circuit device according to Embodiment 4 of the present invention.

As illustrated in FIG. 25, an upper electrode 33, made of W film/Ru film, and an interlayer dielectric film 34 are then formed.

In this embodiment, as described above, heat treatment for improving the quality of the tantalum oxide film 32 is carried out at a relatively low temperature, while the partial pressure ratio of $H_2O$ to $H_2$ is controlled so as to fall within a region bounded by the curve (a) and the curve (c) of FIG. 15, as described with reference to Embodiment 1, so that the oxidation of a metal layer (ex. lower electrode (Ru film), WN film (adhesive layer) or a barrier layer (WN film)) lying below the tantalum oxide film can be reduced.

Alternatively, heat treatment of the tantalum oxide film 32 may be effected, while controlling the partial pressure ratio of $H_2O$ to $H_2$ so as to fall within a region corresponding to a temperature range of 200 to 400° C. in the region bounded by the curve (b) and the curve (c) of FIG. 16. As the constitution of the plug 22 and barrier layer 23 in FIG. 25, that described in Embodiments 2 or 3 may be adopted.

The invention made by the present inventor so far has been described specifically based on certain embodiments. However, it should be borne in mind that the present invention is not limited to the disclosed and illustrated embodiments, but can be modified to an extent not departing from the scope of the invention.

The following is a simple description of the effects available from the typical aspects and features of the invention disclosed in the present application.

Heat treatment for improving the quality of the capacitive insulating film constituting the information storage capacitive element is conducted in a mixed gas atmosphere of $H_2O$ and $H_2$, while controlling a partial pressure ratio of this $H_2O$ and $H_2$ so that oxidation of a metal layer (ex. lower electrode) below this capacitive insulating film can be prevented.

Moreover, the volumetric expansion due to oxidation of the lower electrode can be reduced, whereby breakage of the capacitive insulating film can be prevented. The amount of oxygen in the metal below the capacitive insulating film can be decreased, whereby a conduction failure which will otherwise be caused by an oxide film formed at these sites can be reduced.

Furthermore, it is possible to improve the properties of the information storage capacitive element, thereby improving the properties of the memory cell. Therefore, even in a miniaturized memory cell structure, a desired capacitance can be maintained.

What is claimed is:

1. A method of manufacturing a semiconductor device comprising steps of:
   (a.) forming a first conductor over a semiconductor substrate;
   (b.) forming a second conductor over said first conductor;
   (c.) forming a first insulating film over said second conductor; and
   (d.) after said step (c), heat treating said semiconductor substrate in an atmosphere containing water and hydrogen,
   wherein said second conductor includes a platinum group metal or copper, and
   wherein said first conductor is a barrier layer to prevent a reaction of said second conductor.

2. A method according to claim 1, wherein said second conductor is not oxidized in said step (d).

3. A method according to claim 1, wherein said first insulating film is oxidized in said step (d).

4. A method according to claim 1, wherein said first said insulating film is crystallized in said step (d).

5. A method according to claim 1, wherein a partial pressure ratio of water to hydrogen in said step (d) is almost 1:1.

6. A method according to claim 1, wherein said platinum group metal is selected from a group consisting of platinum (Pt), palladium (Pd), ruthenium (Ru), iridium (Ir) and rhodium (Rh).

7. A method according to claim 1, wherein said first insulating film includes an oxide.

8. A method according to claim 7, wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

9. A method according to claim 7, wherein said oxide is $Ta_2O_5$.

10. A method of manufacturing according to claim 1, wherein said atmosphere contains water and hydrogen having a ratio of water to hydrogen set such that said second conductor is not oxidized in step (c) but said second insulating film is oxidized in step (c).

11. A method of manufacturing according to claim 10, wherein said first said insulating film is crystallized in said step (c).

12. A method of manufacturing a semiconductor device, comprising steps of:
   (a) forming a first conductor over a semiconductor substrate;
   (b) forming a second conductor over said first conductor;
   (c) forming a third conductor over said second conductor;
   (d) forming a first insulating film over said third conductor; and
   (e) after said step (d), heat treating said semiconductor substrate in an atmosphere containing water and hydrogen;

wherein said first conductor includes a silicon, wherein said third conductor is a platinum group metal or copper, and wherein said second conductor is a barrier layer to prevent a reaction between said first conductor and said third conductor.

13. A method according to claim 12, wherein said first to third conductors are not oxidized in said step (e).

14. A method according to claim 12, wherein said first insulating film is oxidized in said step (e).

15. A method according to claim 12, wherein said first insulating film is crystallized in said step (e).

16. A method according to claim 12, wherein a partial pressure ration of said water to hydrogen in said step (e) is almost 1:1.

17. A method according to claim 12, wherein said first conductor includes polycrystalline silicon and said second conductor includes at least one of tungsten and tungsten nitride.

18. A method according to claim 12, wherein said second conductor includes at least one of tungsten and tungsten nitride.

19. A method according to claim 12, wherein said first conductor includes silicon-containing tungsten and said second conductor includes at least one of tungsten and tungsten nitride.

20. A method according to claim 12, wherein said platinum group metal is a metal selected from a group consisting of platinum (Pt), palladium (Pd), ruthenium(Ru), iridium (Ir) and rhodium (Rh).

21. A method according to claim 12, wherein said first insulating film includes an oxide.

22. A method according to claim 21, wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

23. A method according to claim 12, wherein said atmosphere contains water and hydrogen having a ratio of water to hydrogen set such that said first to third conductors are not oxidized in said step (e) but said first insulating film is oxidized in said step (e).

24. A method according to claim 23, wherein said first insulating film is crystallized in said step (e).

25. A method of manufacturing a semiconductor device having, over a semiconductor substrate, a memory cell having a plurality of memory cell selecting MISFETs each including a source, a drain and a gate and a plurality of information storage capacitive elements, comprising steps of:

(a) forming a first conductor electrically connected with either a source or drain of at least one of said MISFETs;

(b) forming a second conductor over said first conductor;

(c) forming a third conductor over said second conductor;

(d) forming a first insulating film over said third conductor;

(e) heat treating said semiconductor, substrate in an atmosphere containing water and hydrogen; and (f) forming a fourth conductor over said first insulating film, wherein said first conductor includes a silicon, wherein said third conductor is a platinum group metal or copper, wherein said second conductor is a barrier layer to prevent reaction between said first conductor and said third conductor, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

26. A method according to claim 25, wherein said third conductor, said first insulating film and said fourth conductor comprise said information storage capacitive element.

27. A method according to claim 25, wherein said first to third conductors are not oxidized in said step (e).

28. A method according to claim 25, wherein said first insulating film is oxidized in said step (e).

29. A method according to claim 25, wherein said first insulating film is crystallized in said step (e).

30. A method according to claim 25, wherein a partial pressure ratio of said water to hydrogen is substantially 1:1 in said step (e).

31. A method according to claim 25, wherein said first conductor includes polycrystalline silicon and said second conductor includes at least one of tungsten and tungsten nitride.

32. A method according to claim 25, wherein said second conductor includes at least one of tungsten and tungsten nitride.

33. A method according to claim 25, wherein said first conductor includes silicon-containing tungsten and said second conductor includes tungsten and tungsten nitride.

34. A method according to claim 25, wherein said platinum group metal is a metal selected from a group consisting of platinum (Pt), palladium (Pd), ruthenium (Ru), iridium (Ir) and rhodium (Rh).

35. A method according to claim 25, wherein said atmosphere contains water and hydrogen having a ratio of water to hydrogen set such that said first to third conducts are not oxidized in said step (e) but said first insulating film is oxidized in said step (e).

36. A method according to claim 35, wherein said first insulating film is crystallized in said step (e).

37. A method of manufacturing a semiconductor device comprising steps of:

(a) forming a first conductor over a semiconductor substrate;

(b) forming a first insulating film over said first conductor; and (c) heat treating said semiconductor substrate at 200 to 400° C. in an atmosphere containing water and hydrogen, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

38. A method according to claim 37, further comprising:

(d) forming a second insulating film over said semiconductor substrate and first insulating film; and (e) forming an interconnect over said second insulating film.

39. A method according to claim 38, wherein said step (c) is conducted between said steps (b) and (d).

40. A method according to claim 37, wherein said first conductor is a platinum group metal or copper.

41. A method according to claim 40, wherein said platinum group metal is a metal selected from a group consisting of platinum (Pt), palladium (Pd), ruthenium (Ru), iridium (Ir) and rhodium (Rh).

42. A method of manufacturing a semiconductor device, comprising steps of:

(a) forming a first conductor over a semiconductor substrate;

(b) forming a second conductor over said first conductor;

(c) forming a third conductor over said second conductor;

(d) forming a first insulating film over said third conductor, and (e) heat treating said semiconductor substrate at 200 to 400° C. in an atmosphere containing water and hydrogen, wherein said third conductor is a platinum group metal or copper, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

43. A method according to claim 42, further comprising:

(f) forming a second insulating film over said semiconductor substrate and first insulating film; and (g) forming an interconnect over said second insulating film.

44. A method according to claim 43, wherein said step (e) is conducted between said steps (d) and (f).

45. A method according to claim 42, wherein said third conductor includes a platinum group metal or copper, and wherein said second conductor is a barrier layer to prevent reaction of said first conductor.

46. A method of manufacturing a semiconductor device having, over a semiconductor substrate, a memory cell having a plurality of memory cell selecting MISFETs including a source, a drain and a gate and a plurality of information storage capacitive elements, comprising steps of:

(a) forming a first conductor electrically connected with either a source or drain of said MISFET;

(b) forming a second conductor over said first conductor;

(c) forming a third conductor over said second conductor;

(d) forming a first insulating film over said third conductor;

(e) heat treating said semiconductor substrate at 200 to 400° C. in an atmosphere containing water and hydrogen; and (f) forming a fourth conductor over said first insulating film, wherein said fist conductor includes a silicon, wherein said third conductor is a platinum group metal or copper, wherein said second conductor is a barrier layer to prevent reaction between said first conductor and said third conductor, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

47. A method according to claim 46, further comprising:

(g) forming a second insulating film over said semiconductor substrate and fourth conductor; and (h) forming an interconnect over said second insulating film.

48. A method according to claim 47, wherein said step (e) is conducted between said steps (d) and (g).

49. A method of manufacturing a semiconductor device comprising steps of:

(a) forming a first conductor over a semiconductor substrate;

(b) forming a first insulating film over said first conductor; and (c) after said step (b), heat treating said semiconductor substrate under conditions permitting oxidation of said first insulating film but not permitting oxidation of said first conductor film, wherein said first conductor is a platinum group metal or copper, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

50. A method according to claim 49, wherein heat treatment of said step (c) is conducted in an atmosphere containing water and hydrogen.

51. A method according to claim 49, wherein heat treatment of said step (c) is conducted at 200 to 400° C.

52. A method of manufacturing a semiconductor device, comprising the steps of:

(a) forming a first conductor over a semiconductor substrate;

(b) forming a first insulating film over said first conductor; and (c) after said step (b), heat treating said semiconductor substrate in an atmosphere containing water and hydrogen, wherein a partial pressure ratio ($[H_2O]/[H_2]$) of said water to said hydrogen exceeds a partial pressure ratio ($[H_2O_{eq1}]/[H_2]_{eq1}$) of $H_2O$ to $H_2$ at a time when System 1 (said first insulating film+$H_2$) and System 2 (a metal comprising said first insulating film+$H_2O$) form an equilibrium at said heat treating temperature, and becomes below a partial pressure ratio ($[H_2O_{eq2}]/[H_2]_{eq2}$) of $H_2O$ to $H_2$ at a time when System 3 (oxide of said first conductor+$H_2$) and System 4 (said first conductor+$H_2O$) form an equilibrium at said temperature.

53. A method according to claim 52, wherein said first conductor is a platinum group metal or copper.

54. A method according to claim 52, wherein said first conductor is a platinum group metal or copper, wherein said first insulating film is an oxide, and wherein said oxide is selected from a group consisting of $Ta_2O_5$, $Ba_xSr_{1-x}TiO_3$, $Al_2O_3$, $TiO_2$, $HfO_2$, $ZrO_2$, $BaTiO_3$ and $SrTiO_3$.

55. A method of manufacturing a semiconductor device, comprising steps of:

(a) forming a first conductor over a semiconductor substrate;

(b) forming a second conductor over said first conductor;

(c) forming a third conductor over said second conductor;

(d) forming a first insulating film over said third conductor; and (e) after said step (d), heat treating said semiconductor substrate in an atmosphere containing water and hydrogen, wherein a partial pressure ratio ($[H_2O]/[H_2]$) of said water to said hydrogen exceeds a partial pressure ratio ($[H_2O_{eq1}]/[H_2]_{eq1}$) of $H_2O$ to $H_2$ at a time when System 1 (said first insulating film+$H_2$) and System 2 (a metal comprising said first insulating film+$H_2O$) form an equilibrium at said heat treating temperature, and becomes below a partial pressure ratio ($[H_2O_{eq2}]/[H_2]_{eq2}$) of $H_2O$ to $H_2$ at a time when System 3 (oxide of said first conductor+$H_2$) and System 4 (said first conductor+$H_2O$) form an equilibrium at said temperature.

56. A method according to claim 55, wherein said third conductor includes a platinum group metal or copper.

57. A method according to claim 55, wherein said first insulating film is $TaO_5$.

58. A method according to claim 55, wherein said first conductor includes tungsten.

59. A method according to claim 55,
wherein said first conductor includes a silicon,
wherein said third conductor is a platinum group metal or copper,
wherein said second conductor is a barrier layer to prevent a reaction between said first conductor and said third conductor,
wherein said first insulating film is an oxide, and
wherein said oxide is selected from a group consisting of $Ta_2O_5$, $BaxSr_{1-x}TiO_3$, $Al_2O_3$, $TiO_2$, $HfO_2$, $ZrO_2$, $BaTiO_3$ and $SrTiO_3$.

* * * * *